(12) United States Patent
Tsujita et al.

(10) Patent No.: US 6,607,992 B2
(45) Date of Patent: Aug. 19, 2003

(54) ANTIREFLECTION COATING AND SEMICONDUCTOR DEVICE MANUFACTURING METHOD

(75) Inventors: Kouichirou Tsujita, Tokyo (JP); Atsumi Yamaguchi, Tokyo (JP); Junjiro Sakai, Tokyo (JP); Kouji Oda, Tokyo (JP); Koichiro Narimatsu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 45 days.

(21) Appl. No.: 09/955,100

(22) Filed: Sep. 19, 2001

(65) Prior Publication Data

US 2002/0123245 A1 Sep. 5, 2002

(30) Foreign Application Priority Data

Jan. 22, 2001 (JP) .......................... 2001-013262

(51) Int. Cl.[7] .............................. H01L 21/31
(52) U.S. Cl. ................. 438/791; 438/238; 438/520; 438/775; 438/676; 257/336; 257/427; 257/640; 257/649; 428/701; 428/535; 428/325; 428/327; 428/432
(58) Field of Search .................. 438/791, 238, 438/520, 775, 676; 257/336, 437, 640, 649; 428/701, 535, 325, 327, 432

(56) References Cited

U.S. PATENT DOCUMENTS

| 5,488,246 A | | 1/1996 | Hayashide et al. |
| 5,721,167 A | * | 2/1998 | Subramanian et al. ...... 438/238 |
| 5,783,365 A | | 7/1998 | Tsujita |
| 5,872,054 A | | 2/1999 | Tsujita |
| 6,083,852 A | * | 7/2000 | Cheung et al. .............. 438/791 |
| 6,300,671 B1 | * | 10/2001 | Moore et al. ................ 257/639 |
| 6,316,372 B1 | * | 11/2001 | DeBoer et al. ............. 438/791 |
| 6,365,320 B1 | * | 4/2002 | Foote et al. .............. 430/270.1 |

OTHER PUBLICATIONS

Qizhi He, et al. "Inorganic Antireflective Coating Process for Deep–UV Lithography", SPIE 98 vol. 3334, pp. 337–346.

Atsumi Yamaguchi, et al. "Improvement of CD control and resolution by optimizing inorganic ARC process", SPIE 2000 vol. 4000, pp. 905–914.

Qun Ying Lin, et al. "Dual Layer Inorganic SiON Bottom ARC for 0.25 $\mu$ m DUV Hard Mask Applications", SPIE 99 vol. 3678, pp. 186–197.

* cited by examiner

Primary Examiner—Matthew Smith
Assistant Examiner—Victor Yevsikov
(74) Attorney, Agent, or Firm—Oblon, Spivak, McClelland, Maier & Neustadt, P.C.

(57) ABSTRACT

An antireflection coating has two-layer structure including lower and upper silicon nitride films (p-SiN films) formed by plasma CVD. For the lower p-SiN film, the real part of its complex index of refraction is set in the range not less than 1.9 nor more than 2.5, the imaginary part is set in the range of not less than 0.9 nor more than 1.7, and the film thickness is set in the range of not less than 20 nm nor more than 60 nm. For the upper p-SiN film, the real part of its complex index of refraction is set in the range not less than 1.7 nor more than 2.4, the imaginary part is set in the range of not less than 0.15 nor more than 0.75, and the film thickness is set in the range of not less than 10 nm nor more than 40 nm.

9 Claims, 28 Drawing Sheets

F I G . 5 2
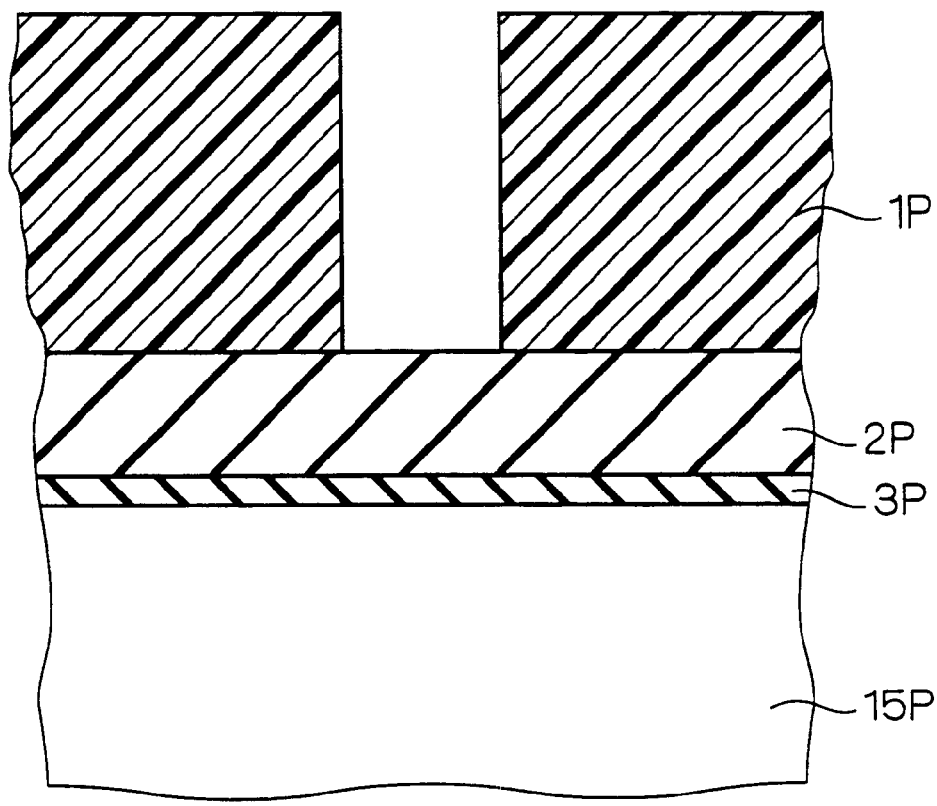

ANTIREFLECTION COATING AND SEMICONDUCTOR DEVICE MANUFACTURING METHOD

BACKGROUND OF THE INVENTION

1. Field of the Invention

The present invention relates to an antireflection coating used in a semiconductor device manufacturing process and to a semiconductor device manufacturing method including a process of forming the same.

2. Description of the Background Art

In general, the interconnection in semiconductor devices is formed by pattern-etching a film of interconnection conductor such as metal, silicide, etc. The method in which resist is applied directly on the interconnection conductor film and the interconnection conductor film is directly etched using the resist as a mask is no longer in common use; the following method is widely used instead. That is to say, a silicon oxide film (also called an oxide film hereinafter) or a silicon nitride film (also called a nitride film hereinafter) is formed on the interconnection conductor film and the oxide film or the like is first patterned by using the resist. Subsequently the interconnection conductor film is pattern-etched by using the patterned oxide film etc. as a mask.

In this process, an antireflection coating (ARC) is provided to prevent the exposure light for exposing the resist from reflecting at a film lying under the resist. FIG. 45 is a schematic sectional view showing a semiconductor device (or a semiconductor substrate) 101P, which is used to explain a conventional antireflection coating 10P. The semiconductor device 101P has a tungsten silicide (WSi) film 4P for the gate electrode, an oxide film 3P, a nitride film 2P, an antireflection coating 10P and a resist 1P stacked in this order. The nitride film 2P is made of stoichiometric silicon nitride ($Si_3N_4$).

The antireflection coating 10P is composed of a single layer of silicon nitride formed by plasma CVD (Chemical Vapor Deposition: hereinafter the silicon nitride film is referred to also as a p-SiN film). The antireflection coating 10P is also called a p-SiN film 10P hereinafter using the same reference character. In order to allow the p-SiN film 10P to function as the antireflection coating, it is preferred that its complex index of refraction (n−i×k) approximately satisfy the conditions $1.5 \leq n \leq 2.5$, $0.2 \leq k \leq 1.5$. The characters n, k and i are, respectively, the real part and the imaginary part of the complex index of refraction and the imaginary number (imaginary unit).

It is assumed here that, for the p-SiN film 10P, n=2.13, k=0.83, and its film thickness is 47.5 nm (475 angstroms).

FIG. 46 is a contour diagram showing the results of calculation (simulation) of the reflectance R of the exposure light in the semiconductor device 101P using the p-SiN film 10P. The horizontal and vertical axes in FIG. 46 respectively show the film thickness of the oxide film 3P and that of the nitride film 2P in the semiconductor device 101P. The reflectance R was calculated considering the multiple reflection of the light, so that the calculated results almost perfectly agree with experimental results. While the calculation of the reflectance R assumes that the exposure light is at a wavelength of 248 nm, similar calculation results are obtained at other wavelengths.

It can be seen from FIG. 46 that the reflectance R varies between about 2 and 8% with the film thickness variations of the oxide film 3P and the nitride film 2P. The variation of the reflectance R directly affects the patterning dimensions of the resist. This is described below.

FIG. 47 is a schematic sectional view showing another semiconductor device 102P used to explain the antireflection coating 10P. The semiconductor device 102P has a polycrystalline silicon film 5P for the gate electrode, the oxide film 3P, the p-SiN film 10P, the resist 1P and a top antireflection coating (TARC) 6P stacked in this order.

FIG. 48 is a graph showing the results of calculation of the resist patterning dimension in the semiconductor device 102P using the p-SiN film 10P. The horizontal and vertical axes in FIG. 48 respectively show the thickness of the oxide film 3P of the semiconductor device 102P and the patterning dimension (line width) of the resist 1P; FIG. 48 shows the results of calculation at varied exposure light energies. The conditions used for exposure of the resist 1P are: NA (Numerical Aperture)=0.65; annular ⅔; exposure mask L/S (Line and Space) pattern 200 nm. It can be seen from FIG. 48 that the dimension of the resist 1P varies by 17 nm as the film thickness of the oxide film 3P varies.

While the two semiconductor devices 101P and 102P differ in detailed structure, they are common in that a transparent insulating film is provided under the antireflection coating 10P. Therefore the description above applies to both of the semiconductor devices 101P and 102P.

Achieving further size reduction of the semiconductor devices requires finer dimensional accuracy. For example, a semiconductor device with a line width of 130 nm is required to satisfy a total dimensional accuracy of about ±10% (13 nm), so that the above-described variation of the resist patterning dimension, caused by the film thickness variations of the oxide film 3P and nitride film 4P, must be restricted to about ±5 nm. That is to say, the existing process is insufficient.

SUMMARY OF THE INVENTION

A first aspect of the present invention is directed to an antireflection coating provided between an underlying layer and a resist in a semiconductor device manufacturing process. According to the first aspect, the antireflection coating comprises: a lower plasma silicon nitride film provided on the underlying layer, the lower plasma silicon nitride film being formed by a plasma chemical vapor deposition and containing more silicon than stoichiometric silicon nitride ($Si_3N_4$); and an upper plasma silicon nitride film provided on the lower plasma silicon nitride film, the upper plasma silicon nitride film being formed by the plasma chemical vapor deposition and containing more silicon than the stoichiometric silicon nitride ($Si_3N_4$); wherein the lower plasma silicon nitride film has a complex index of refraction in which the real part and the imaginary part have values respectively in the range of not less than 1.9 nor more than 2.5 and in the range of not less than 0.9 nor more than 1.7, and the lower plasma silicon nitride film has a thickness in the range of not less than 20 nm nor more than 60 nm, and wherein the upper plasma silicon nitride film has a complex index of refraction in which the real part and the imaginary part have values respectively in the range of not less than 1.7 nor more than 2.4 and in the range of not less than 0.15 nor more than 0.75, and the upper plasma silicon nitride film has a thickness in the range of not less than 10 nm nor more than 40 nm.

Preferably, according to a second aspect, in the antireflection coating, the complex index of refraction of the lower plasma silicon nitride film is (2.1−i×1.2) and the thickness of the lower plasma silicon nitride film is 50 nm, and the complex index of refraction of the upper plasma silicon nitride film is (2.0−i×0.3) and the thickness of the upper plasma silicon nitride film is 30 nm.

Preferably, according to a third aspect, the antireflection coating further comprises a silicon oxide film formed on the upper plasma silicon nitride film.

Preferably, according to a fourth aspect, in the antireflection coating, the silicon oxide film has a thickness of about 4 to 10 nm.

According to a fifth aspect, a semiconductor device manufacturing method comprises the steps of: (a) forming an underlying layer; (b) forming an antireflection coating on the underlying layer; and (c) forming a resist on the antireflection coating and patterning the resist through exposure and developing; the step (b) comprising the steps of (b-1) forming a lower plasma silicon nitride film on the underlying layer by a plasma chemical vapor deposition, the lower plasma silicon nitride film containing more silicon than stoichiometric silicon nitride ($Si_3N_4$), and (b-2) forming an upper plasma silicon nitride film on the lower plasma silicon nitride film by the plasma chemical vapor deposition, the upper plasma silicon nitride film containing more silicon than the stoichiometric silicon nitride ($Si_3N_4$), wherein the lower plasma silicon nitride film has a complex index of refraction in which the real part and the imaginary part have values respectively in the range of not less than 1.9 nor more than 2.5 and in the range of not less than 0.9 nor more than 1.7, and the lower plasma silicon nitride film has a thickness in the range of not less than 20 nm nor more than 60 nm, and wherein the upper plasma silicon nitride film has a complex index of refraction in which the real part and the imaginary part have values respectively in the range of not less than 1.7 nor more than 2.4 and in the range of not less than 0.15 nor more than 0.75, and the upper plasma silicon nitride film has a thickness in the range of not less than 10 nm nor more than 40 nm.

Preferably, according to a sixth aspect, in the semiconductor device manufacturing method, the complex index of refraction of the lower plasma silicon nitride film is (2.1−i×1.2) and the thickness of the lower plasma silicon nitride film is 50 nm, and the refractive index of the upper plasma silicon nitride film is (2.0−i×0.3) and the thickness of the upper plasma silicon nitride film is 30 nm.

Preferably, according to a seventh aspect, in the semiconductor device manufacturing method, the step (b-1) and the step (b-2) are continuously performed in the same chamber.

Preferably, according to an eighth aspect, in the semiconductor device manufacturing method, the step (b) further comprises a step (b-3) of exposing an exposed surface of the upper plasma silicon nitride film to a plasma of a gas which contains oxygen to form a thermal oxide film.

Preferably, according to a ninth aspect, the semiconductor device manufacturing method further comprises the steps of; (d) forming a silicon oxide film covering the upper and lower plasma silicon nitride films, and (e) applying at least one of an etching process and a polishing process to the silicon oxide film.

According to the first aspect, the reflectance of the exposure light can be reduced during the resist exposure so that the resist, and hence the underlying layer, can be accurately patterned. Moreover, the light intensity distribution of the standing wave of the exposure light produced in the resist can be improved to make the patterned resist less apt to break. Furthermore, since the lower and upper plasma silicon nitride films are formed by using plasma chemical vapor deposition, the two plasma silicon nitride films can be continuously formed in the same chamber. That is to say, the formation of the antireflection coating offers good productivity.

According to the second aspect, the reflectance of the exposure light can be reduced during the resist exposure, regardless of the film thickness of the underlying layer.

According to the third aspect, it is possible to prevent the lower and upper plasma silicon nitride films from lessening the effect of acid generated in a chemically amplified resist.

According to the fourth aspect, in the semiconductor device manufacturing method, the silicon oxide film is formed so thin that the silicon oxide film and the upper and lower plasma silicon nitride films can be removed without the need to perform separated process steps (i.e. they can be removed simultaneously).

According to the fifth aspect, the reflectance of the exposure light can be reduced in the step (c), so that the resist, and hence the underlying layer, can be accurately patterned. Also, the light intensity distribution of the standing wave of the exposure light produced in the resist can be improved to prevent the patterned resist from breaking.

According to the sixth aspect, the reflectance of the exposure light can be reduced during the resist exposure, independently of the film thickness of the underlying layer.

According to the seventh aspect, the formation of the antireflection coating offers good productivity.

According to the eighth aspect, the thermal oxide film prevents the lower and upper plasma silicon nitride films from lessening the acid effect of the chemically amplified resist. Also, in the semiconductor device manufacturing process, the thermal oxide film is formed so thin (about 4 nm) in the step (b-3) that the thermal oxide film and the upper and lower plasma silicon nitride films can be removed without the need for separated process steps (i.e. they can be removed simultaneously). Moreover, the step (b-3) uses a plasma of an oxygen-containing gas, so that the lower and upper plasma silicon nitride films and the thermal oxide film can be continuously formed in the chamber used to form the lower and upper plasma silicon nitride films, thus providing good productivity in the antireflection coating formation.

According to the ninth aspect, in the step (e), the upper and lower plasma silicon nitride films can be used as a stopper in the process of etching or/and polishing the silicon oxide film. Accordingly, the stoichiometric silicon nitride ($Si_3N_4$), which has conventionally been used as the stopper, can be formed thinner or removed. In general, the plasma silicon nitride film offers higher deposition rate than the stoichiometric silicon nitride, so that the stopper can be formed with good productivity. Also, in general, the plasma silicon nitride film produces smaller film stress than the stoichiometric silicon nitride, so that the film stress in the semiconductor device can be reduced.

The present invention has been made to solve the problems explained earlier, and a first object of the present invention is to provide an antireflection coating and a semiconductor device manufacturing method which enable the resist to be accurately patterned and also enable the resist to be formed in such shape as will not easily break.

A second object of the present invention is to provide an antireflection coating and a semiconductor device manufacturing method which can achieve the first object regardless of the film thickness of the underlying layer beneath the antireflection coating.

A third object of the present invention is to provide an antireflection coating and a semiconductor device manufacturing method which are suitable for use with a chemically amplified resist.

These and other objects, features, aspects and advantages of the present invention will become more apparent from the following detailed description of the present invention when taken in conjunction with the accompanying drawings.

BRIEF DESCRIPTION OF THE DRAWINGS

FIG. 23 is a schematic sectional view used to explain a semiconductor device to which an antireflection coating according to a second preferred embodiment is applied.

FIGS. 24 to 29 are schematic sectional views used to explain a semiconductor device manufacturing method according to a third preferred embodiment.

FIG. 52 is a sectional view used to explain a conventional semiconductor device manufacturing method.

DESCRIPTION OF THE PREFERRED EMBODIMENTS

<First Preferred Embodiment>

Figure 1:
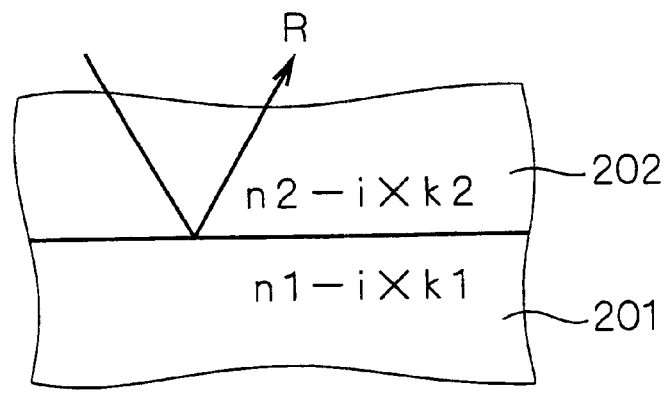
FIG. 1 is a schematic diagram used to explain the reflection of light.

First, FIG. 1 is a schematic diagram used to explain the reflection of light. As shown in FIG. 1, the first and second layers 201 and 202 are in contact with each other, where the first layer 201 has a complex index of refraction (n1−i×k1) and the second layer 202 has a complex index of refraction (n2−i×k2). The characters n1 and n2 are the real parts of the complex indices of refraction, which determine the light velocity in the substance. The characters k1 and k2 are the imaginary parts of the complex indices of refraction, which correspond to the absorption coefficient of the light. A larger value of the imaginary part indicates a higher light blocking property and a smaller value of it indicates a higher transmittance. Hereinafter the complex index of refraction may simply be called an index of refraction.

Light traveling in the second layer 202 to the first layer 201 is reflected at the interface between the layers 201 and 202, where the reflectance R is given as:

$$R = \frac{(n1-n2)^2 + (k1-k2)^2}{(n1+n2)^2 + (k1+k2)^2}$$

The reflectance R becomes smaller as the two real parts n1 and n2 become closer to each other and also as the two imaginary parts k1 and k2 become closer to each other.

Figure 2:
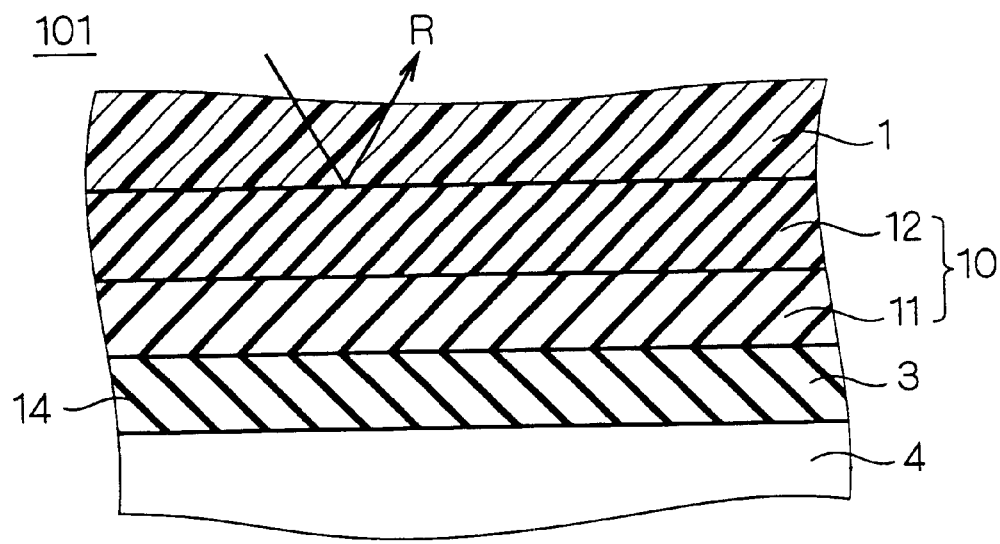
FIG. 2 is a schematic sectional view used to explain a semiconductor device to which an antireflection coating according to a first preferred embodiment is applied.

FIG. 2 is a schematic sectional view used to explain a semiconductor device (or a semiconductor substrate) 101 using an antireflection coating 10 according to a first preferred embodiment. In the semiconductor device 101, the antireflection coating 10 is composed of an inorganic material and disposed between, and in contact with, a resist 1 and a silicon oxide film (which may be also called an oxide film hereinafter) 3 formed as an underlying layer (which is optically transparent to the exposure light wavelength) 14. More specifically, the antireflection coating 10 has a double-layer structure including silicon nitride films 11 and 12 formed by plasma chemical vapor deposition (CVD: which may be also called p-SiN films hereinafter). Hereinafter, the p-SiN film 11 in contact with the underlying layer 14 may be referred to also as a lower p-SiN film 11 and the p-SiN film 12 disposed on the lower p-SiN film 11, on the side of the resist 1, may be referred to also as an upper p-SiN film 12.

The p-SiN films 11 and 12 formed by plasma CVD have a chemical structure expressed as $Si_xN_y(x/y \geq 3/4)$, where Si excessively exists over the number of chemical covalent bonds of the stoichiometric silicon nitride ($Si_3N_4$). For the formation of the p-SiN films 11 and 12, an excess of Si can be included by setting the ratio of flow rate of the $SiH_4$ gas, with respect to that of the $N_2O$ gas, in the CVD material gas, to be higher than the ratio for the stoichiometric silicon nitride. The p-SiN films 11 and 12 have etching property intermediate between the stoichiometric silicon nitride ($Si_3N_4$) and the silicon oxide film. For example, while it is very difficult to etch the stoichiometric silicon nitride ($Si_3N_4$) under silicon-oxide etching conditions, the p-SiN films 11 and 12 can be etched (though at slower rates than the silicon oxide film) by using the silicon-oxide etching conditions.

In particular, for the lower p-SiN film 11, the real part n in the complex index of refraction is set in the range of not less than 1.9 nor more than 2.5 (preferably around 2.1), the imaginary part k is set in the range of not less than 0.9 nor more than 1.7 (preferably around 1.2), and the film thickness is set in the range of not less than 20 nm nor more than 100 nm (preferably around 50 nm). The lower p-SiN film 11 thus blocks the exposure light traveling toward the transparent underlying layer 14 to prevent the reflectance R from being affected by the film thickness variation of the underlying layer 14.

For example, the lower p-SiN film 11 having the complex index of refraction (n−i×k) shown above can be formed by CVD by setting the film formation conditions as follows: flow rates of $SiH_4$ gas, $N_2$ gas and $N_2O$ gas respectively at 220 sccm (=220×10$^{-3}$ liters/min), 5000 sccm, 150 sccm; RF power at 130 W; formation pressure at 4.25 Torr (1 Torr= 133.322 Pa); formation temperature at 400° C.

For the upper p-SiN film 12, the real part n in the complex index of refraction is set in the range of not less than 1.7 nor more than 2.4 (preferably around 2.0), the imaginary part k is set in the range of not less than 0.15 nor more than 0.75 (preferably around 0.3), and the film thickness is set in the range of not less than 10 nm nor more than 60 nm (preferably around 30 nm). The upper p-SiN film 12 thus reduces the reflectance R through the interference effect.

For example, the upper p-SiN film 12 having the complex index of refraction (n−i×k) shown above can be formed by CVD by setting the film formation conditions as follows: flow rates of $SiH_4$ gas, $N_2$ gas and $N_2O$ gas respectively at 95 sccm, 5000 sccm, 150 sccm; RF power at 160 W; formation pressure at 5 Torr; formation temperature at 400° C.

In the CVD, the film quality uniformity and the deposition rate can be controlled by adjusting the pressure and the RF power.

For example, the semiconductor device 101 of FIG. 2 can be obtained by: forming the oxide film 3 by CVD on the tungsten silicide film 4 formed by sputtering, sequentially forming the lower and upper p-SiN films 11 and 12 under the conditions shown above, and applying the resist 1.

Figure 3:
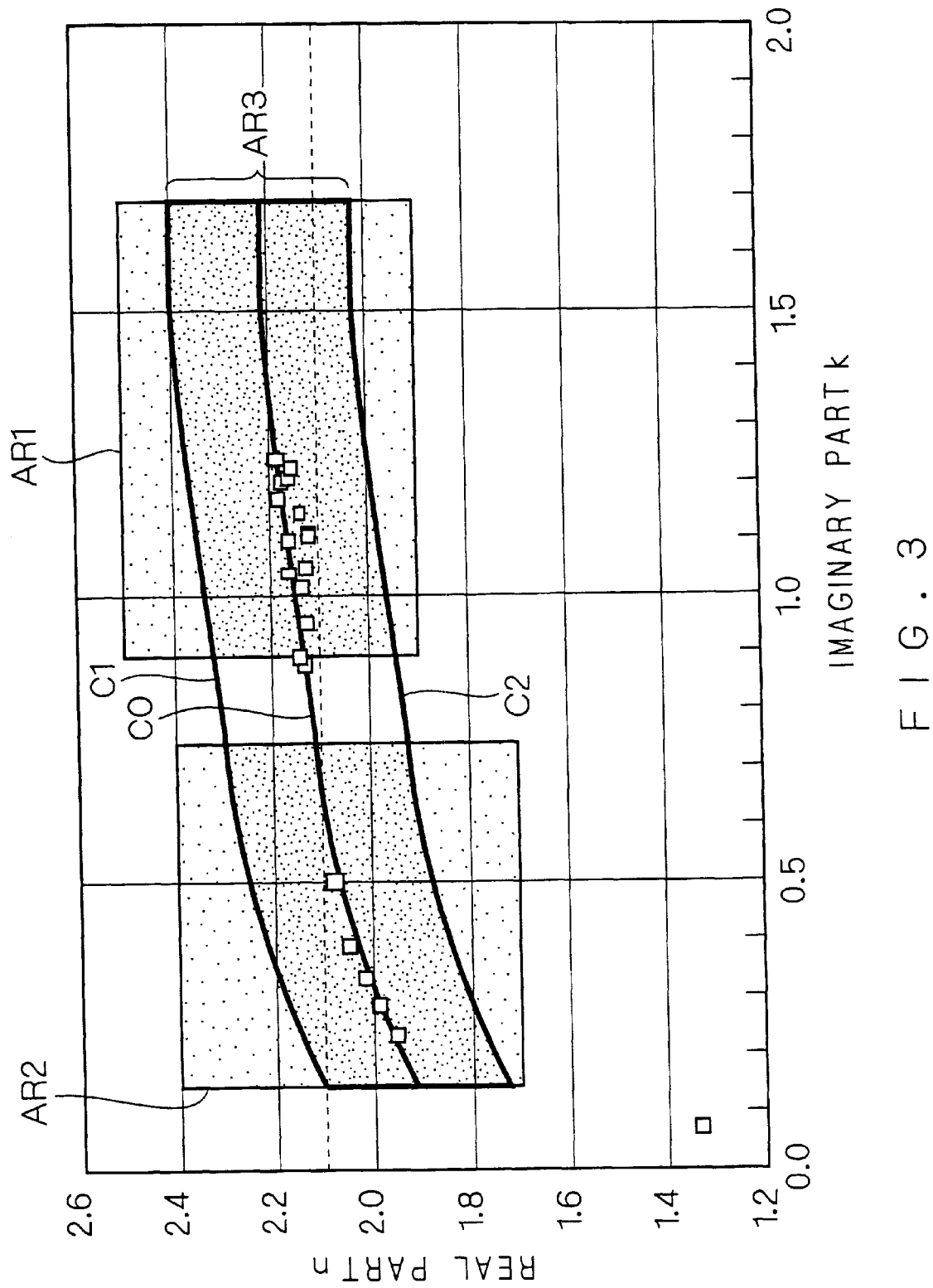
FIG. 3 is a diagram showing the correlation between the imaginary part k and the real part n in the complex indices of refraction of the upper and lower p-SiN films of the first preferred embodiment.

FIG. 3 is a diagram showing the correlation (experimental results) between the imaginary part k and the real part n of the p-SiN films 11 and 12. In FIG. 3, the horizontal axis shows the imaginary part k and the vertical axis shows the real part n. The white squares in FIG. 3 (□) show experimental values. As shown by the white squares and the characteristic curve C0 connecting them, the real part n increases as the imaginary part k increases in the p-SiN films 11 and 12 (i.e. they have a positive correlation). Thus the correlation shown in FIG. 3 is obtained first and then the complex indices of refraction of the lower and upper p-SiN films 11 and 12 are set on the basis of their correlation.

Specifically, for example, considering the variations in characteristics of the p-SiN films which are caused depending on the film forming apparatus, the characteristic curve C0 is shifted by ±0.2 in the vertical axis direction and the region AR3 between the shifted characteristic curves C1 and C2 is defined as the correlation region of the real part n and the imaginary part k. Then the regions AR1 and AR2 are selected for the complex indices of refraction desired for the p-SiN films 11 and 12. The real part n and the imaginary part k of the complex index of refraction of the lower p-SiN film 11 are defined in the region where the two regions AR1 and AR3 overlap. Similarly, the real part n and the imaginary part k of the complex index of refraction of the upper p-SiN film 12 are defined in the region where the two regions AR2 and AR3 overlap. When the correlation between the real part n and the imaginary part k in the complex indices of refraction of the p-SiN films 11 and 12 has thus been obtained in advance, it is not necessary to repeatedly perform the experiments, and the complex indices of refraction (n−i×k) can be realistically and practically determined by taking the correlation into account.

The settings of the complex indices of refraction and the film thicknesses of the lower and upper p-SiN films 11 and 12 are now described in greater detail. The calculations (simulations) about the exposure light reflection etc. take into account the multiple reflection of the light in the antireflection coating 10 etc., so that the calculated results and experiments almost perfectly agree. While the calculations were carried out at an exposure light wavelength of 248 nm, similar results are obtained at other wavelengths.

First, the real parts n of the complex indices of refraction of the p-SiN films 11 and 12 are described. In general, the real part n of the complex index of refraction of the resist 1 is about 1.8 to 1.9 and the real parts n of the p-SiN films 11 and 12 are about 2.0 to 2.5; the resist 1 and the p-SiN films 11 and 12 thus have close real parts n. Values around 2.2 are adopted as the real parts n of the p-SiN films 11 and 12 considering that a currently common p-SiN film has a real part n of 2.23 and that the value around 2.2 is nearly intermediate between the real part n of the resist 1 and those of the p-SiN films 11 and 12.

Figure 45:
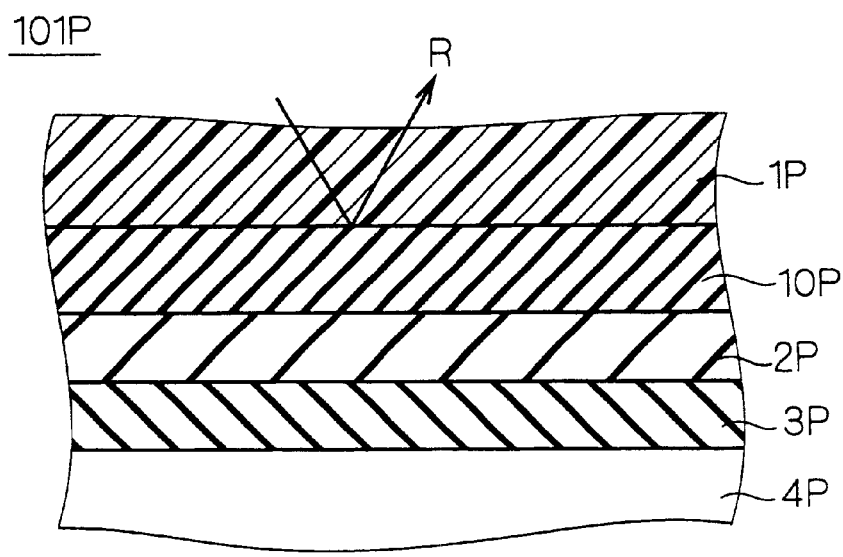
FIG. 45 is a schematic sectional view of a semiconductor device used to explain a conventional antireflection coating.

Next, the imaginary parts k of the complex indices of refraction (n−i×k) of the p-SiN films 11 and 12 are described. To allow the p-SiN films 11 and 12 to function as the antireflection coating, it will be necessary that the values be set as $0.2 \leq k \leq 1.5$, as in the conventional antireflection coating 10P (see FIG. 45). However, since the imaginary part k of the resist 1, about 0.01 to 0.02, considerably differs from the imaginary parts k of the p-SiN films 11 and 12, the imaginary parts k of the p-SiN films 11 and 12 are defined as shown below.

Figure 4:
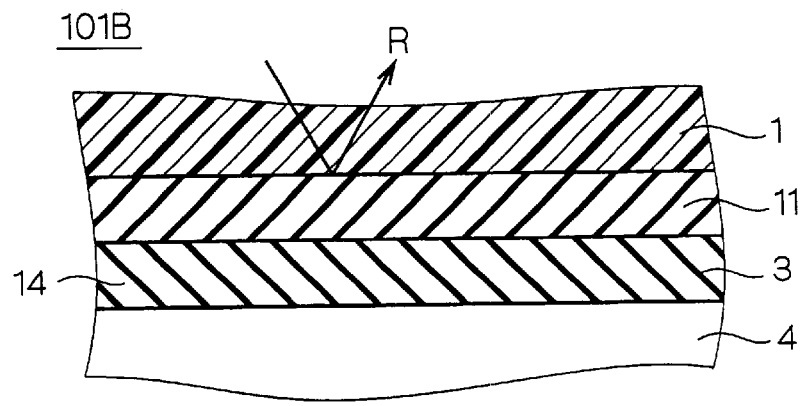
FIG. 4 is a schematic sectional view showing a semiconductor device used to explain the setting of the imaginary part k in the complex index of refraction of the lower p-SiN film of the first preferred embodiment.

The imaginary part k of the lower p-SiN film 11 is described first. FIG. 4 is a schematic sectional view showing a semiconductor device (or a semiconductor substrate) 101B used to explain the setting of the imaginary part k of the lower p-SiN film 11. The semiconductor device 101B is used to examine the effect of the thickness of the oxide film 3 on the reflectance R; the semiconductor device 101B has a stacked-layer structure of the tungsten silicide film 4 oxide film 3 lower p-SiN film 11 resist 1.

Figure 5:
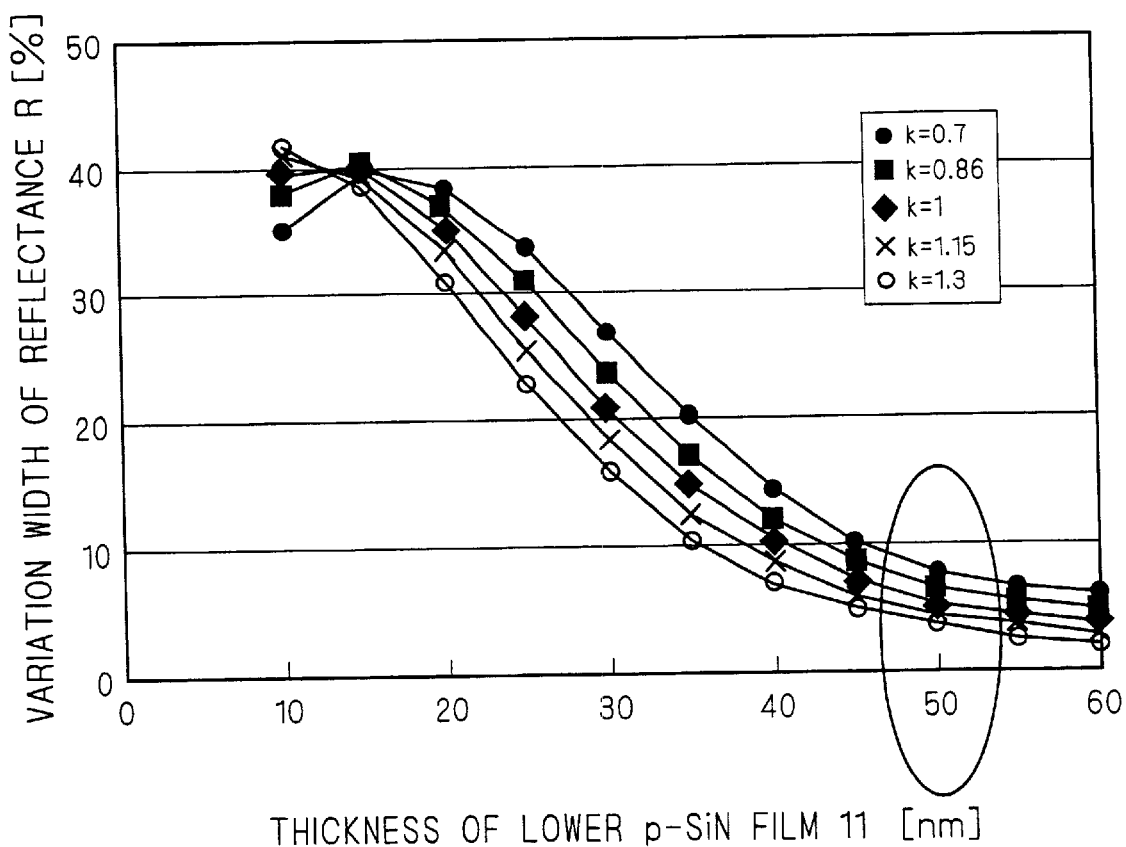
FIG. 5 is a graph showing the results of calculation about the reflectance at the interface between the resist and the lower p-SiN film of the first preferred embodiment.

FIG. 5 is a graph showing the results of calculation about the reflectance R at the interface between the lower p-SiN film 11 and the resist 1 in the semiconductor device 101B. In this graph, the horizontal axis shows the thickness of the lower p-SiN film 11 and the vertical axis shows the variation width (maximum-minimum) of the reflectance R with the thickness of the oxide film 3 varying in the range from 100 to 300 nm. The graph shows the results calculated using the imaginary part k of the lower p-SiN film 11 as a parameter, where k=0.7, 0.86, 1, 1.15, 1.3. It is assumed here that the real part n of the complex index of refraction of the lower p-SiN film 11 has the value 2.23 shown above.

It can be seen from FIG. 5 that the variation width of the reflectance R becomes smaller as the p-SiN film 11 becomes thicker and as the imaginary part k of the lower p-SiN film 11 becomes larger. For example, when the lower p-SiN film 11 is too thick, the aspect ratio in etching increases and then the productivity is lowered. Considering this, the thickness of the lower p-SiN film 11 will preferably be around 50 nm where the change (or the changing rate) of the variation width of the reflectance R is relatively small, and the thickness will practically be in the range of not less than 20 nm nor more than 60 nm.

As can be seen from the correlation shown in FIG. 3 described earlier, setting a large imaginary part k in the complex index of refraction of the lower p-SiN film 11 causes its real part n to vary away from the real part n of the resist 1 (=about 1.8 to 1.9). Therefore it will be preferred that the lower p-SiN film 11 have an imaginary part k around 1.15. Thus, a more realistic or practical example of the complex index of refraction of the lower p-SiN film 11 is $(2.1-i \times 1.2)$.

Figure 6:
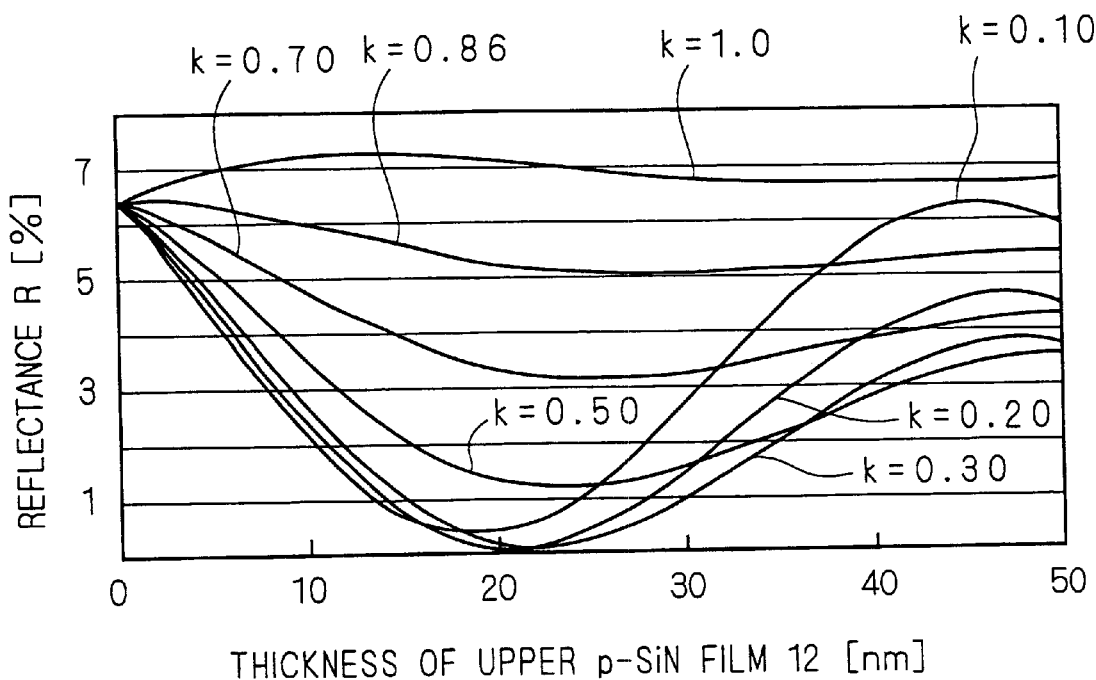
FIG. 6 is a graph showing the results of calculation about the reflectance at the interface between the resist and the upper p-SiN film of the first preferred embodiment.

Next, the imaginary part k of the upper p-SiN film 12 is described. FIG. 6 is a graph showing the results of calculation about the reflectance R and the thickness of the upper p-SiN film 12 in the semiconductor device 101 (see FIG. 2). In this graph, the horizontal axis shows the thickness of the upper p-SiN film 12 and the vertical axis shows the reflectance R. This graph shows the results calculated by using the imaginary part k of the upper p-SiN film 12 as a parameter, where k=0.1, 0.2, 0.3, 0.5, 0.7, 0.86 and 1.0. It is assumed here that the real part n of the upper p-SiN film 12 has the value 2.23 shown above and the complex index of refraction and the thickness of the lower p-SiN film 11 are respectively $(2.23-i \times 1.15)$ and 50 nm as shown above. The thickness of the oxide film 3 is 150 nm.

It can be seen from FIG. 6 that when the imaginary part k of the upper p-SiN film 12 is small, the reflectance R takes very small values (minimum values) around the film thickness of 20 nm (it is almost zero). For example, when the imaginary part k is in the range from about 0.20 to 0.70 and the film thickness is in the range from about 10 nm to 40 nm, the reflectance R can be a practically usable value of 2 to 3%, or lower. Also, for example, when the imaginary part k is in the range from about 0.20 to 0.40 and the film thickness is in the range from about 15 nm to 30 nm, the reflectance R can be 1% or less.

As shown in the correlation diagram of FIG. 3, the real part n rapidly varies when the imaginary part k is too small. Accordingly, considering stable reproducibility of the film characteristics (particularly the complex index of refraction in this case), a more realistic or practical example of the complex index of refraction of the upper p-SiN film 12 is $(2.0-i \times 0.3)$. The deposition rate of the p-SiN film is generally so high (about 5 to 10 nm/sec) that a film about 10 nm thick is formed in several seconds. Since the plasma is unstable in such a short film formation time, it is difficult to obtain stable film thickness and stable film quality. Therefore, values around 30 nm, e.g. in the range of not less than 20 nm nor more than 35 nm, are more realistic or practical film thicknesses for the upper p-SiN film 12.

Figure 7:
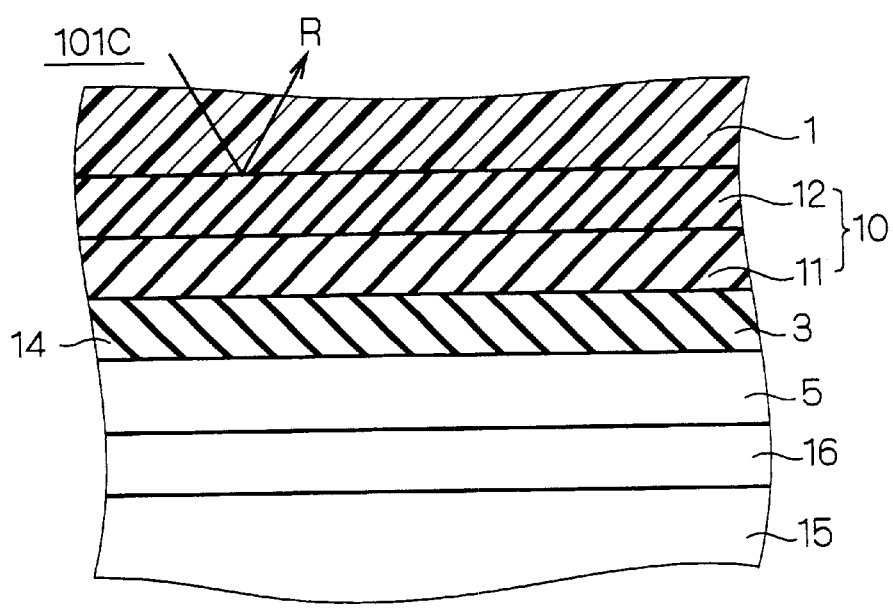
FIG. 7 is a schematic sectional view used to explain a semiconductor device to which the antireflection coating of the first preferred embodiment is applied.

Next, the results of calculation of the reflectance etc. carried out using a semiconductor device (or a semiconductor substrate) having the antireflection coating 10 is explained, where a semiconductor device 101C having the structure shown in FIG. 7 is used. The semiconductor device 101C has a stacked-layer structure of the silicon substrate 15/oxide film 16/polycrystalline silicon film 5/oxide film 3 as transparent underlying layer 14/lower p-SiN film 11/upper p-SiN film 12/resist 1. The antireflection coating 10 of the semiconductor device 101C is formed on the transparent underlying layer 14; in regard to the reflection of the exposure light, the structure of the semiconductor device 101C is the same as that of the semiconductor device 101 shown in FIG. 2.

In the calculation of the reflectance in the semiconductor device 101C, the indices of refraction of the silicon substrate 15, the oxide film 16 and the polycrystalline silicon film 5 were assumed to be $(2.42-i \times 3.18)$, 1.51, and $(1.63-i \times 3.58)$, respectively. The indices of refraction of the oxide film 3 forming the underlying layer 14, the lower p-SiN film 11, the upper p-SiN film 12, and the resist 1 were assumed to be 1.51, $(2.2-i \times 1.17)$, $(2.0-i \times 0.32)$, and $(1.8-i \times 0.01)$, respectively. The thickness of the oxide film 16 and that of the polycrystalline silicon film 5 were assumed to be 17 nm and 20 nm, respectively. In the calculation of the reflectance R, the film thickness of the polycrystalline silicon film 5 is equivalent to infinity, since it serves as a perfectly light blocking film at thicknesses of 20 nm or larger.

Figure 8:
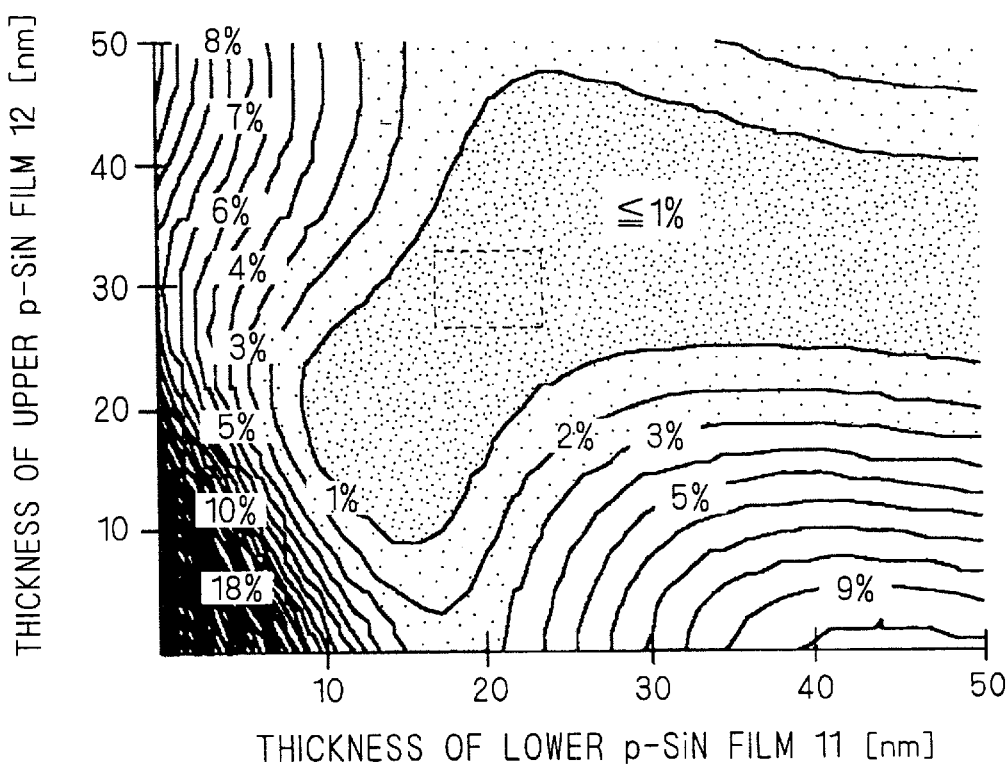
FIG. 8 is a contour diagram used to explain the reflectance in the semiconductor device shown in FIG. 7.

FIG. 8 is a contour diagram showing the results of calculation about the relation between the thicknesses of the lower and upper p-SiN films 11 and 12 and the reflectance R in the semiconductor device 101C. The calculation shown in FIG. 8 assumes the thickness of the oxide film 3 to be 90±10 nm. FIG. 8 indicates that the reflectance R can be 2 to 3%, or lower, in the range where the thickness of the lower p-SiN film 11 is about 7 nm or larger and that of the upper p-SiN film 12 is from about 17 to 50 nm, for example. Also, for example, in the range in which the film thickness of the lower p-SiN film 11 is 20±3 nm and that of the upper p-SiN film 12 is 30±3 nm (see the rectangular area surrounded by the broken line in FIG. 8), the reflectance R can be 1% or lower.

Figure 9:
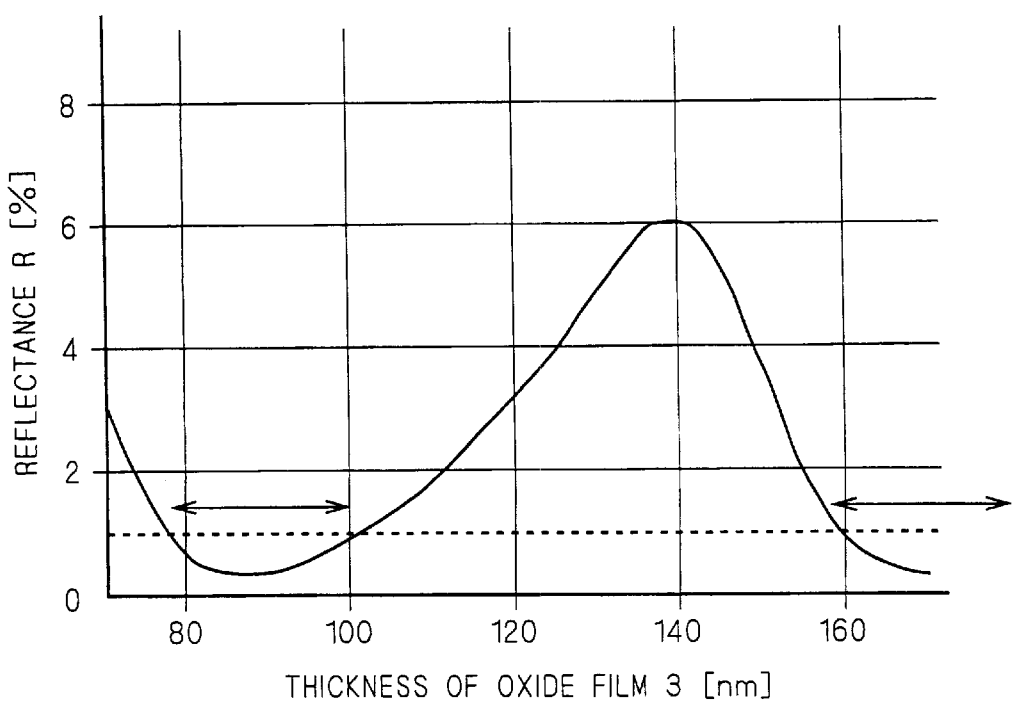
FIG. 9 is a graph used to explain the reflectance in the semiconductor device shown in FIG. 7.

FIG. 9 is a graph showing the results of calculation about the relation between the thickness of the oxide film 3 as the underlying layer 14 and the reflectance R in the semiconductor device 101C. It is assumed in the calculation shown in FIG. 9 that the thicknesses of the lower and upper p-SiN films 11 and 12 are respectively 20±3 nm and 30±3 nm (see the rectangular area surrounded by the broken line in FIG. 8). FIG. 9 indicates that the reflectance can be 3% or lower in the range where the thickness of the oxide film 3 is from about 70 to 120 nm, for example, and the reflectance R can be 1% or lower in the range of 90 ±10 nm shown above.

Figure 10:
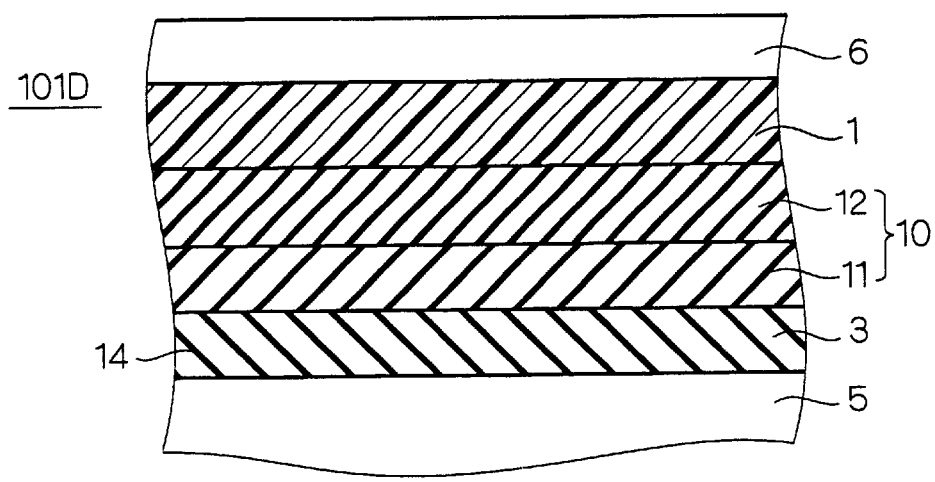
FIG. 10 is a schematic sectional view used to explain a semiconductor device to which the antireflection coating of the first preferred embodiment is applied.

The antireflection coating 10 and a semiconductor device manufacturing method using the same enables accurate formation of the resist 1. This is now described referring to FIGS. 10 and 11. FIG. 10 is a schematic sectional view used to explain a semiconductor device 101D to which the antireflection coating 10 is applied, where the semiconductor device 101D has a stacked-layer structure of the polycrystalline silicon 5/oxide film 3 as the underlying layer 14/lower p-SiN film 11/upper p-SiN film 12/resist 1/top antireflection coating (so-called TARC) 6.

Figure 11:
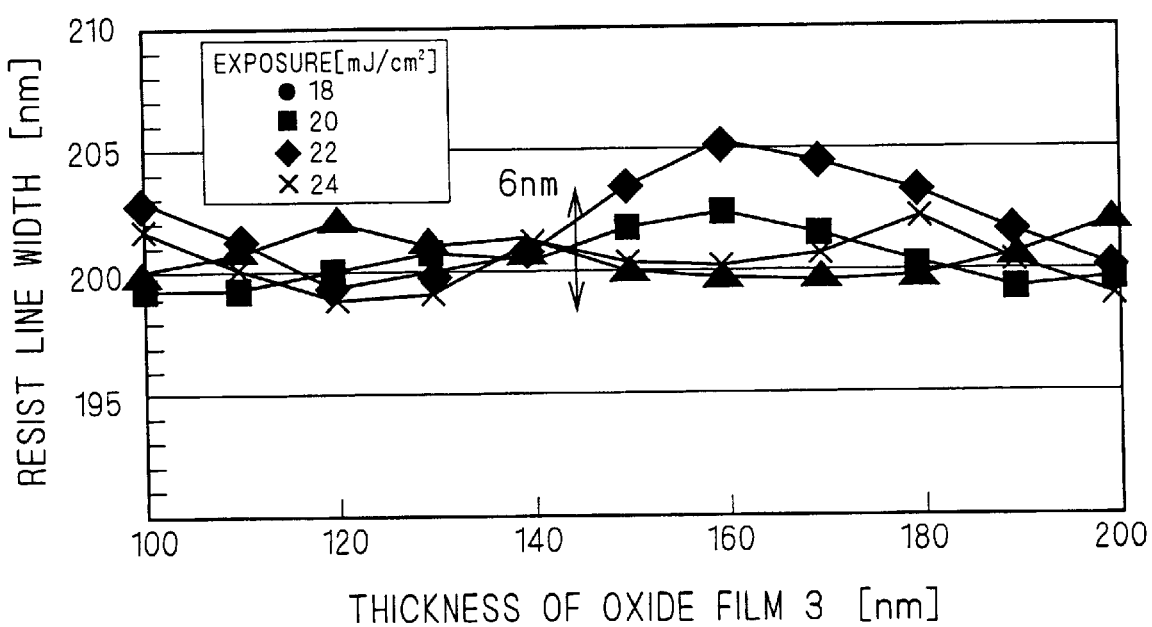
FIG. 11 is a graph showing the results of calculation of the patterning dimension of the resist in the semiconductor device shown in FIG. 10.
Figure 48:
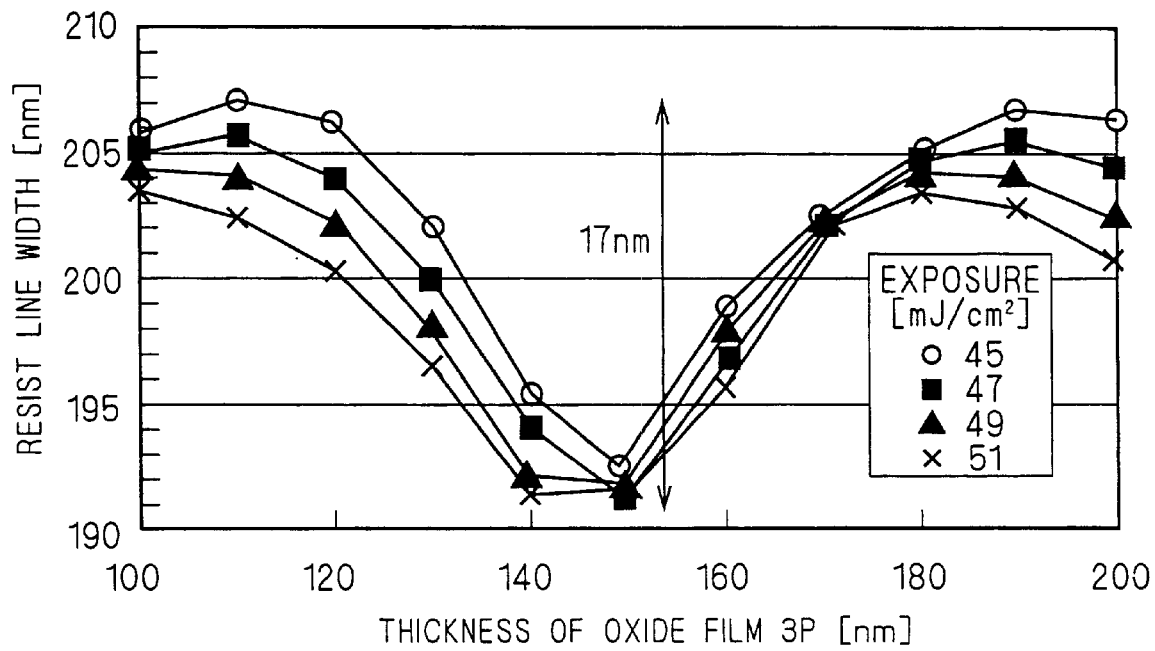
FIG. 48 is a graph showing the patterning dimension of the resist in the semiconductor device shown in FIG. 47.

FIG. 11 is a graph showing the results of calculation about the patterning dimension of the resist 1 in the semiconductor device 101D. FIG. 11 corresponds to FIG. 48 explained earlier, where the horizontal and vertical axes show the film thickness of the oxide film 3 in the semiconductor device 101D and the patterning dimension (line width) of the resist 1; FIG. 11 shows results calculated at varying exposure light energies. The exposure conditions used for the resist 1 are: NA (Numerical Aperture)=0.65, annular ⅔, and exposure mask L/S (Line and Space) pattern 200 nm. According to FIG. 11, the variation of the line width of the resist 1 can be suppressed to 6 nm with the film thickness variation of the oxide film 3. In the case of the conventional single-layer antireflection coating 10P, the line width variation of the resist 1P was 17 nm (see FIG. 48)

Figure 12:
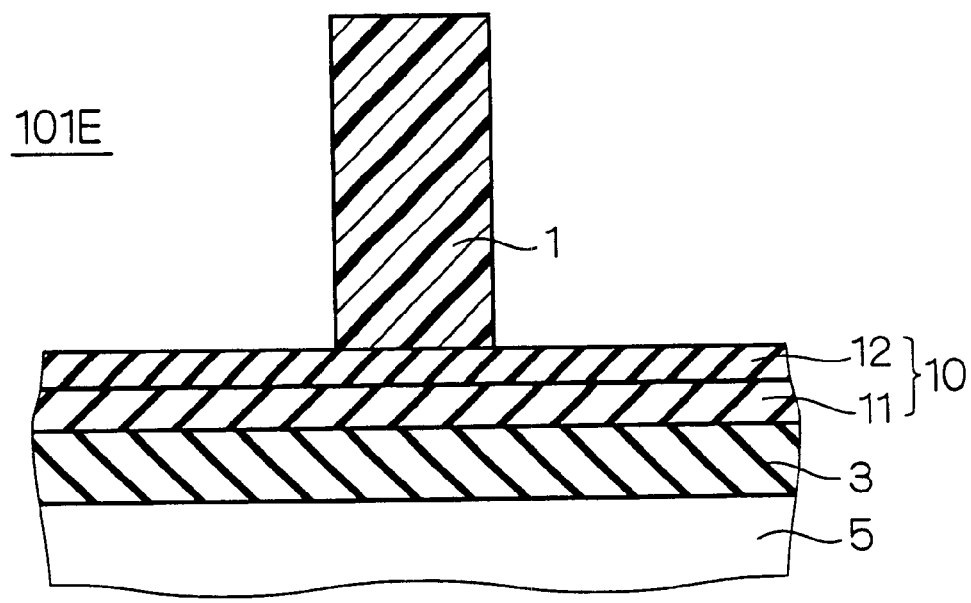
FIG. 12 is a schematic sectional view showing a semiconductor device having the resist patterned by using the antireflection coating of the first preferred embodiment.
Figure 13:
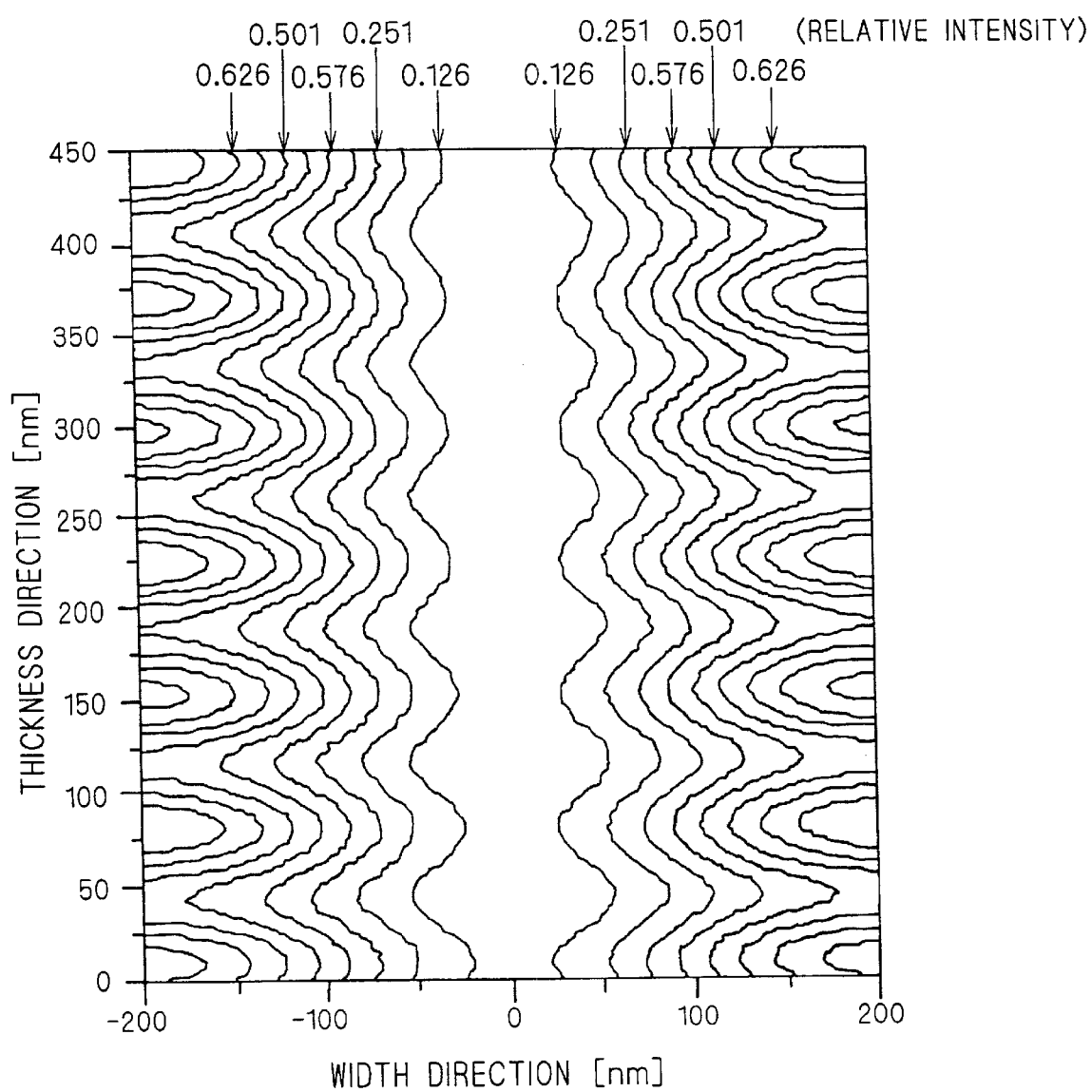
FIG. 13 is a diagram showing the light intensity distribution in the resist produced during pattern exposure in the presence of the antireflection coating of the first preferred embodiment.
Figure 49:
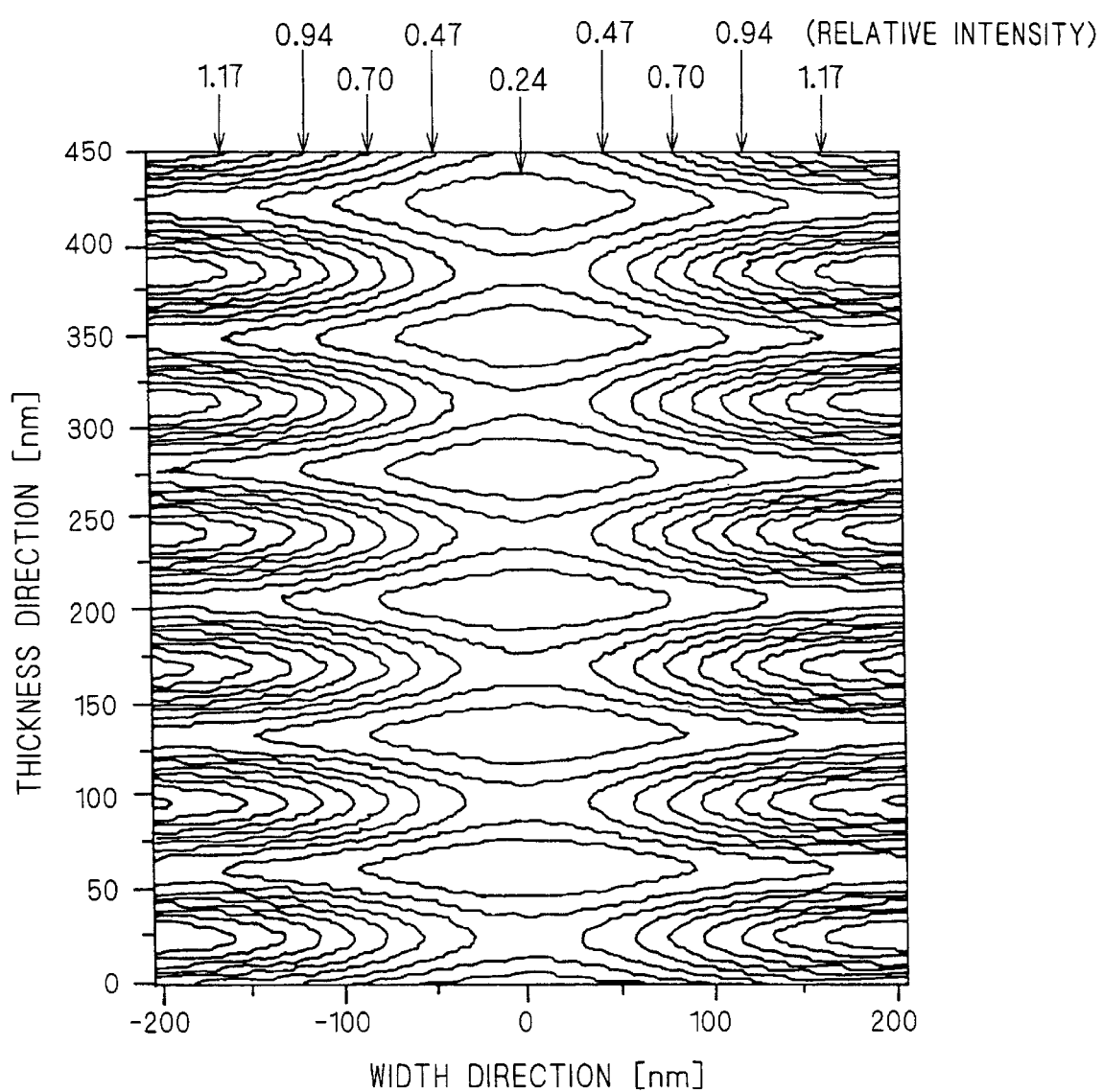
FIG. 49 is a diagram showing the light intensity distribution produced in the resist during pattern exposure in the presence of the conventional antireflection coating.

As compared with the conventional single-layer antireflection coating 10P, the antireflection coating 10 and a semiconductor device manufacturing method using the same satisfactorily suppress breakage or collapse of the patterned resist 1. This effect is now explained referring to FIGS. 12, 13 and 49. FIG. 12 is a schematic sectional view showing a semiconductor device 101E having the resist 1 patterned by using the antireflection coating 10. FIG. 13 is a diagram showing the light intensity distribution (calculated results) in the resist 1 produced during the pattern exposure in the presence of the antireflection coating 10 (i.e. in the semiconductor device 101. For comparison, FIG. 49 shows the light intensity distribution (calculated results) in the resist 1P in the presence of the conventional antireflection coating 10P instead of the antireflection coating 10. In FIGS. 13 and 49, the horizontal and vertical axes respectively show the width and thickness directions of the resists 1 and 1P, and the origin (the zero point) on the horizontal axis corresponds to the center in the width direction of the patterned resists 1 and 1P.

As shown in FIG. 12, the semiconductor device 101E has a stacked-layer structure of the polycrystalline silicon 5/oxide film 3/lower p-SiN film 11/upper p-SiN film 12/resist 1. It is assumed in the calculation of FIG. 13 that the complex indices of refraction of the lower and upper p-SiN films 11 and 12 are respectively (2.1−i×1.2) and (2.0−i×0.35), their film thicknesses are respectively 50 nm and 30 nm, and the oxide film 3 is 100 nm thick. The calculation shown in FIG. 49 assumed the conventional antireflection coating 10P to be a p-SiN film having a complex index of refraction of (2.1−i×0.8) and a film thickness of 48 nm.

It is also assumed that the resist 1 is a positive resist and is pattern-exposed by using a mask pattern for isolated line of 120 nm in width. The exposure conditions used for the resist 1 are: NA=0.65, annular ⅔, and exposure mask L/S pattern 200 nm.

During the exposure of the resist 1, the exposure light is reflected at the interface between the resist 1 and the antireflection coating 10 and at the interface between the resist 1 and the air (i.e. at the exposed surface of the resist 1) and standing wave is produced in the resist 1. Due to the standing wave, the light intensity, in other words the exposure intensity of the resist 1, is distributed as shown in FIGS. 13 and 49 in the resist 1. Since the exposed areas of the positive resist are dissolved when developed, the resist 1 then exhibits a sectional shape corresponding to the distribution shown in FIG. 13 or 49.

That is to say, in FIG. 49, the conventional antireflection coating 10P allows the intensive exposure light to penetrate into the areas of the resist 1 that are to remain (i.e. these areas are intensively exposed) and the resultant section of the resist 1 in the thickness direction shows periodic undulations with large amplitude (in other words, it has considerably narrowed parts). Therefore the resist is susceptible to breakage at the narrowed parts.

In contrast, as shown in FIG. 13, the antireflection coating 10 can reduce the amplitude of the undulations explained above, so that the narrowed parts of the resist 1 can be wider than those obtained with the conventional antireflection coating 10P. The antireflection coating 10 thus suppresses the breakage or collapse of the patterned resist 1.

Also, since the lower and upper plasma silicon nitride films 11 and 12 are formed by plasma CVD, the two p-SiN films 11 and 12 can be continuously formed in the same chamber. That is to say, according to the antireflection coating 10 and a semiconductor device manufacturing method using the same, the antireflection coating offers superior productivity in formation.

The antireflection coating 10 can be applied also to an underlying layer 14 other than the oxide film 3 to provide the same effects as those obtained when the underlying layer 14 is the oxide film 3.

Figure 14:
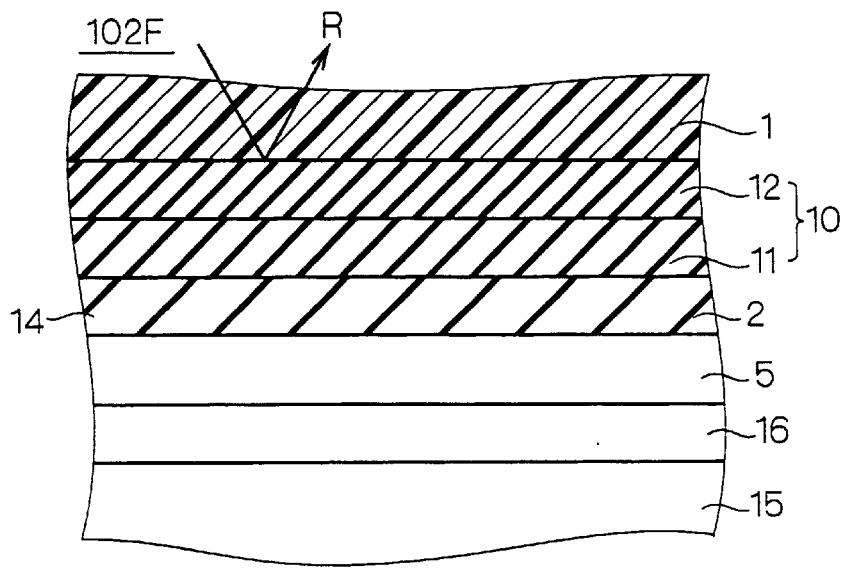
FIG. 14 is a schematic sectional view used to explain a semiconductor device to which the antireflection coating of the first preferred embodiment is applied.

FIG. 14 is a schematic sectional view showing a semiconductor device 101F to which the antireflection coating 10 is applied. The semiconductor device 101F has a stacked-layer structure in which the oxide film 3 in the semiconductor device 101C of FIG. 7 has been replaced by a silicon nitride film (hereinafter also called a nitride film) 2, where the nitride film 2 corresponds to the underlying layer 14. The nitride film 2 is made of stoichiometric silicon nitride ($Si_3N_4$) having a refractive index of 2.27. The nitride film 2 is formed by, for example, thermal CVD, prior to the formation of the antireflection coating 10.

Figure 15:
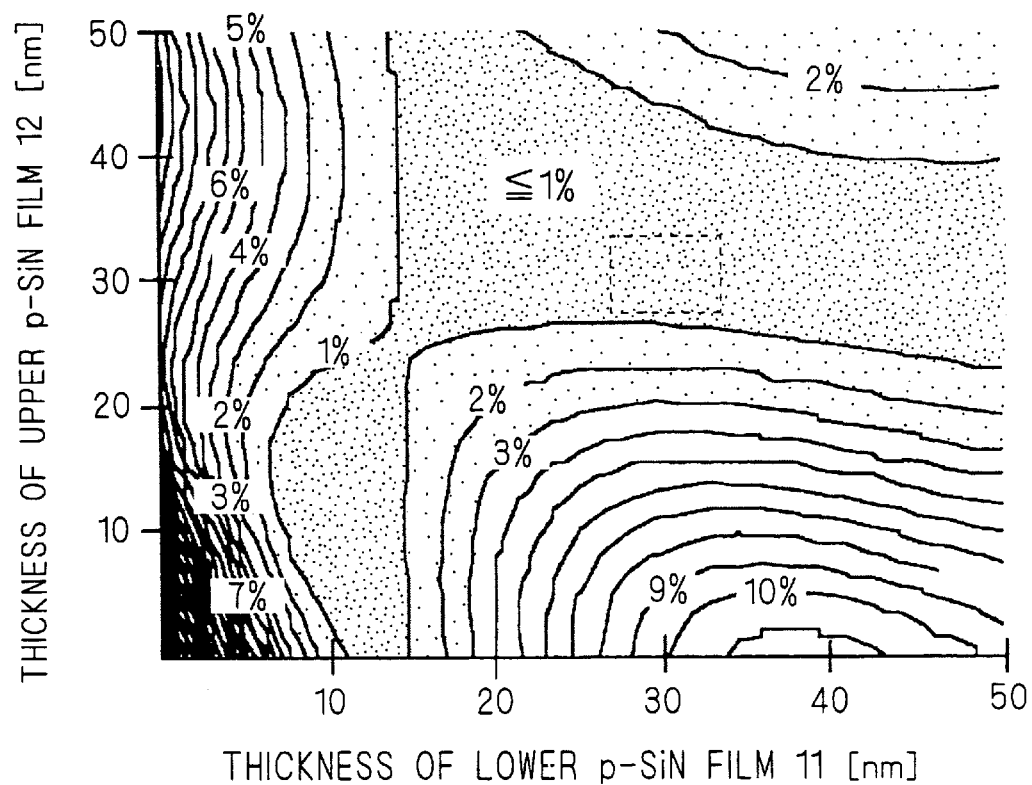
FIG. 15 is a contour diagram used to explain the reflectance in the semiconductor device shown in FIG. 14.

FIG. 15 is a contour diagram showing the reflectance R which, like that shown in FIG. 8, was obtained by calculation. The calculation of FIG. 15 assumed the thickness of the nitride film 2 to be 115±10 nm. FIG. 15 indicates that the reflectance R can be 2 to 3%, or lower, in the range in which the thickness of the lower p-SiN film 11 is about 5 nm or larger and the thickness of the upper p-SiN film 12 is from about 20 nm to 50 nm, for example. Also for example, in the range in which the thickness of the lower p-SiN film 11 is 20±3 nm and that of the upper p-SiN film 12 is 30±3 nm (the rectangular range surrounded by the broken line in FIG. 15), the reflectance R can be 1% or lower.

Figure 16:
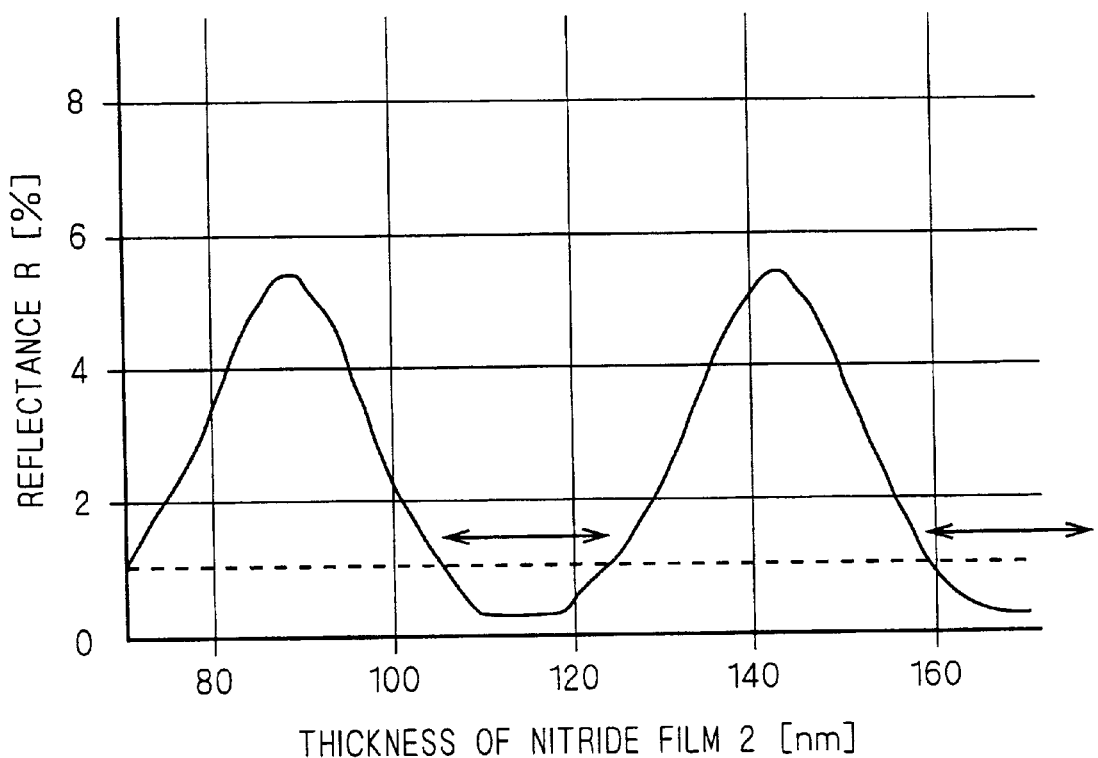
FIG. 16 is a graph used to explain the reflectance in the semiconductor device shown in FIG. 14.

FIG. 16 is a graph showing the relation between the thickness of the nitride film 2 and the reflectance R, which was calculated in the same way as that shown in FIG. 9. The calculation of FIG. 16 assumed that the film thicknesses of the lower and upper p-SiN films 11 and 12 were respectively 20±3 nm and 30±3 nm (see the rectangular region surrounded by the broken line in FIG. 15). According to FIG. 16, the reflectance R can be 3% or lower in the range in which the thickness of the nitride film 2 is from about 95 to 130 nm, and the reflectance R can be 1% or lower in the range of 115±10 nm shown above.

Figure 17:
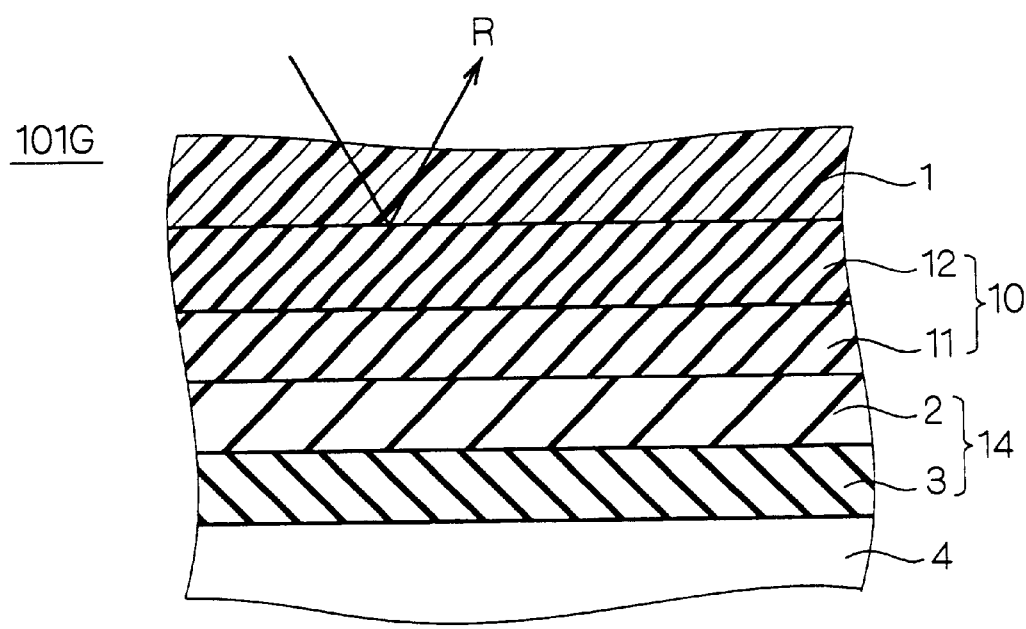
FIG. 17 is a schematic sectional view used to explain a semiconductor device to which the antireflection coating of the first preferred embodiment is applied.

FIG. 17 is a schematic sectional view showing a semiconductor device 101G to which the antireflection coating 10 is applied. The semiconductor device 101G has a stacked-layer structure of the tungsten silicide film 4/nitride film 2/oxide film 3/lower p-SiN film 11/upper p-SiN film 12/resist 1, where the oxide film 3 and the nitride film 2 correspond to the transparent underlying layer 14. The semiconductor device 101G has a structure in which the conventional single-layer antireflection coating 10P in the semiconductor device 101P shown in FIG. 45 has been replaced by the antireflection coating 10.

Figure 18:
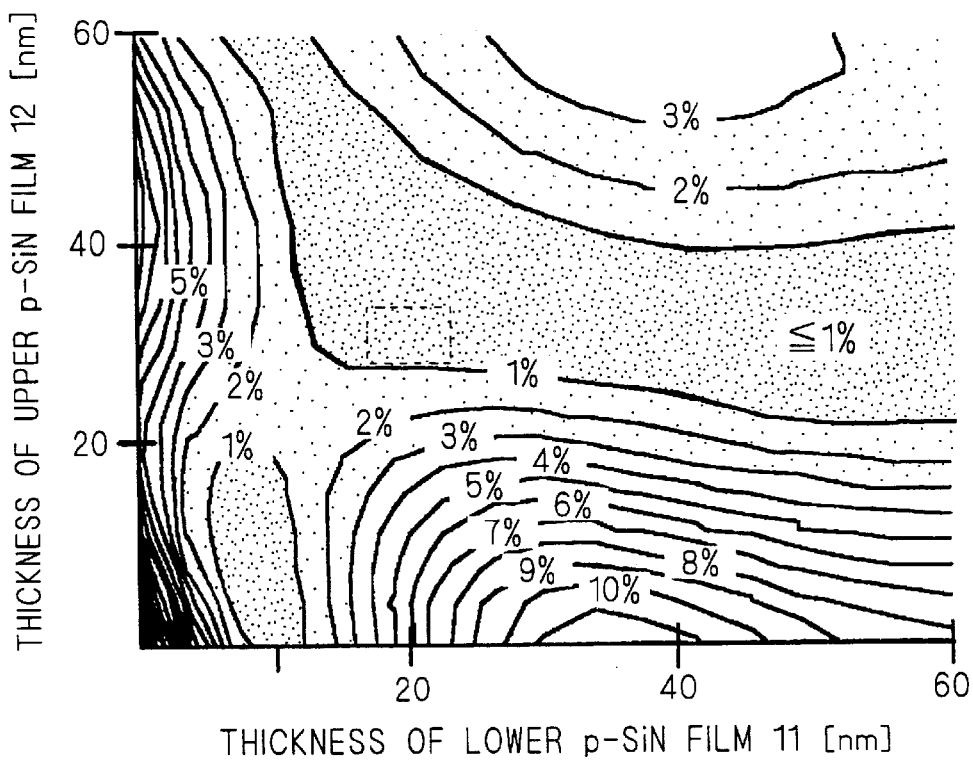
FIGS. 18 to 20 are contour diagrams used to explain the reflectance in the semiconductor device shown in FIG. 17.

FIG. 18 is a contour diagram showing the reflectance R obtained by calculation like that of FIG. 8. The calculation of FIG. 18 assumed that the thickness of the oxide film 3 and that of the nitride film 2 were respectively 80±4 nm and 70±3.5 nm (which correspond to the rectangular region surrounded by the broken line in FIG. 19 described later), and that the index of refraction of the tungsten silicide film 4 was (2.42−i×3.18). FIG. 18 shows that the reflectance R can be 2 to 3%, or lower, in the range in which the thickness of the lower p-SiN film 11 is about 4 nm or larger and that of the upper p-SiN film 12 is from about 20 nm to 55 nm, for example. Also, for example, in the range in which the thickness of the lower p-SiN film 11 is 20±3 nm and that of the upper p-SiN film 12 is 30±3 nm (the rectangular range surrounded by the broken line in FIG. 18), the reflectance R can be 1% or lower.

Figure 19:
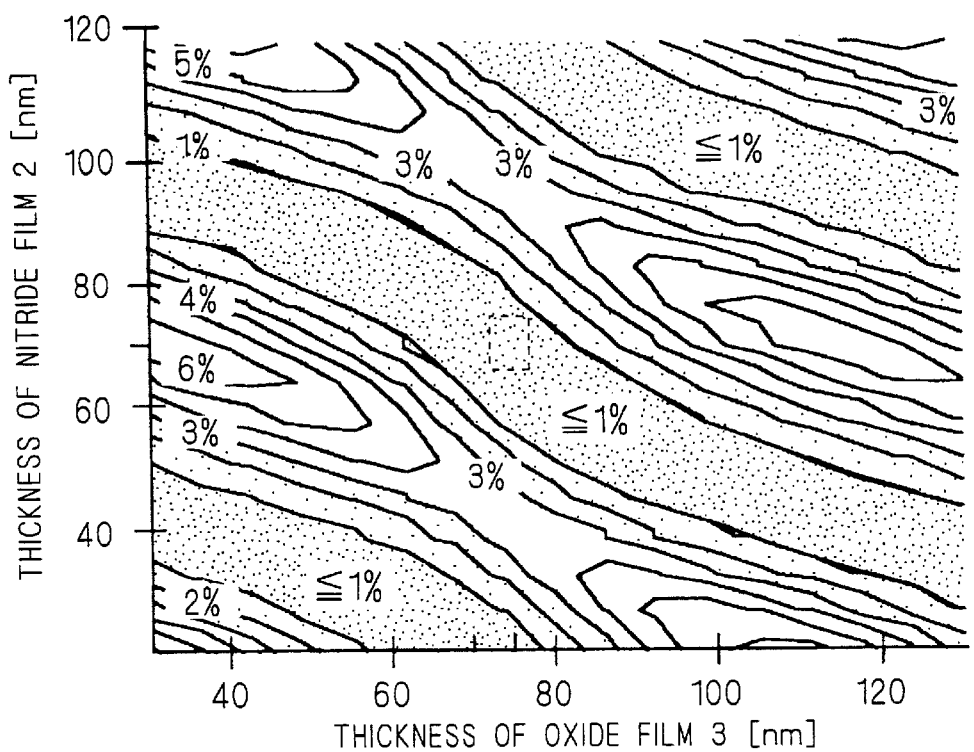

FIG. 19 is a contour diagram showing the results of calculation about the relation between the reflectance R and the thicknesses of the oxide film 3 and the nitride film 2 as the underlying layer 14. The calculation of FIG. 19 assumed that the film thicknesses of the lower and upper p-SiN films 11 and 12 were respectively 20±3 nm and 30±3 mm (see the rectangular region surrounded by the broken line in FIG. 18).

Figure 46:
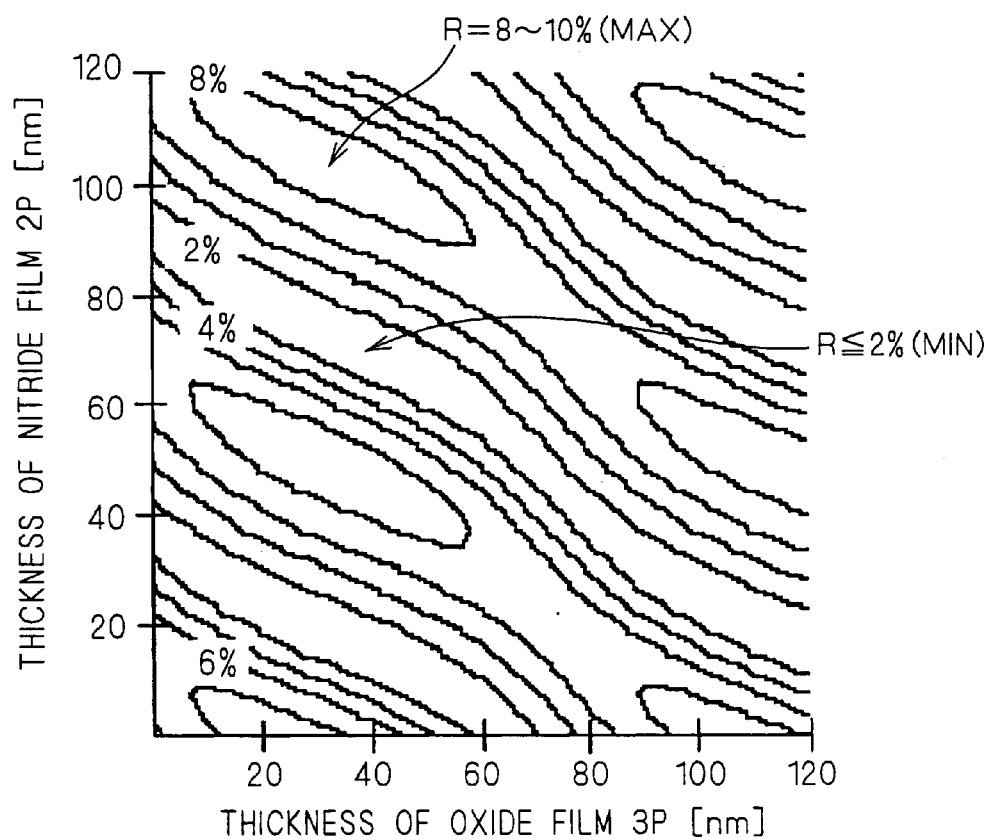
FIG. 46 is a contour diagram showing the reflectance of the exposure light in the semiconductor device shown in FIG. 45.
Figure 47:
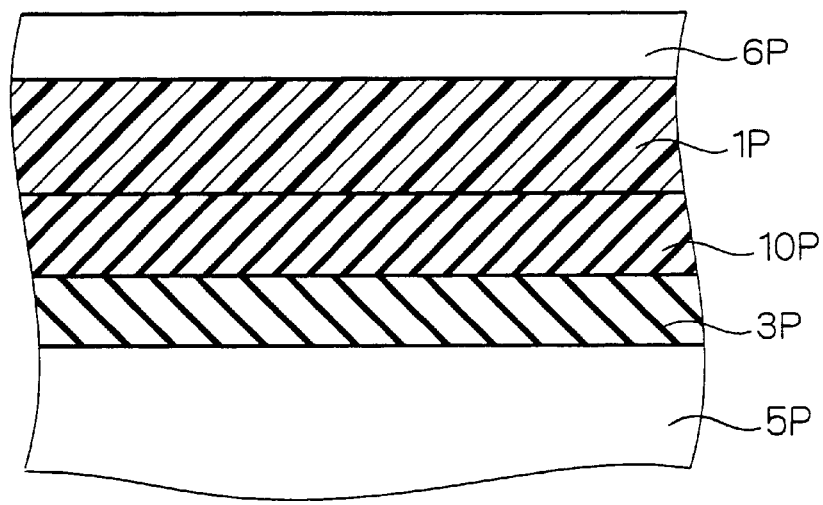
FIG. 47 is a schematic sectional view showing another semiconductor device used to explain the conventional antireflection coating.

As can be seen by comparing FIG. 19 and FIG. 46 about the conventional semiconductor device 101P, the antireflection coating 10 enables lower reflectance than the conventional single-layer antireflection coating 10P. Furthermore, the reflectance can be 2 to 3% or lower, or even 1% or lower, at appropriate, various combinations of the thickness of the oxide film 3 and that of the nitride film 2.

Figure 20:
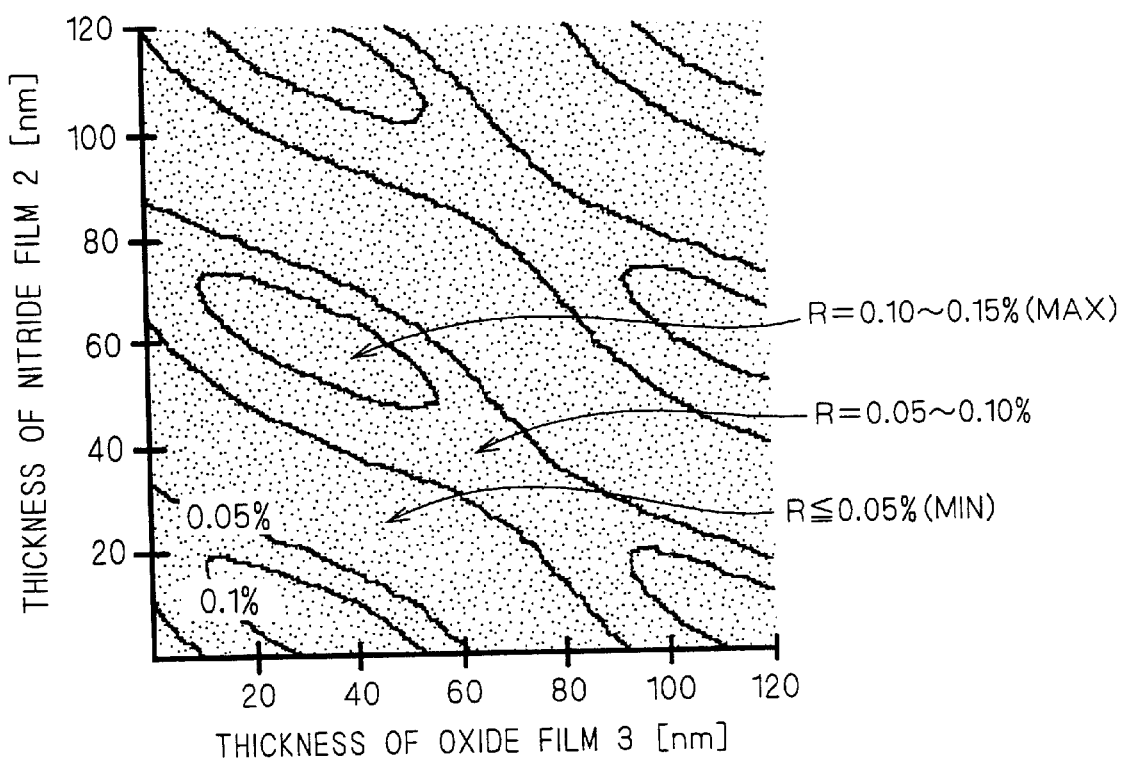

Also, FIG. 20 is a contour diagram like FIG. 19. The calculation of FIG. 20 assumed that the complex indices of refraction of the lower and upper p-SiN films 11 and 12 were respectively (2.15−i×1.2) and (2.00−i×0.3), and the film thicknesses were 50 nm and 30 nm. FIG. 20 shows that the reflectance R can be 1% or lower (even as very low as 0.05 to 0.15%), regardless of the film thicknesses of the oxide film 3 and the nitride film 2. Further, in FIG. 20, the difference between the maximum and minimum values of the reflectance R is much smaller than that with the conventional single-layer antireflection coating 10P, which shows that the film thickness variations of the oxide film 3 and the nitride film 2 exert less influence upon the variation of the reflectance R.

As can be seen from FIGS. 8, 9, 15, 16, 18 and 19, by controlling the film thickness of the underlying layer 14, the lower p-SiN film 11 can be formed thinner (e.g. 20 nm) while suppressing the reflectance R. In this case the antireflection coating 10 can be removed easily.

<Second Preferred Embodiment>

Now, in fine patterning processes with line widths of 200 nm or smaller, KrF (248 nm), ArF (193 nm), etc. are used as the exposure light; chemically amplified resists are used with such exposure lights.

Figure 21:
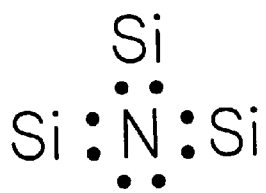
FIGS. 21 and 22 are schematic diagrams used to explain the reaction in which a lone-pair electrons in the silicon nitride film attract acid.
Figure 22:
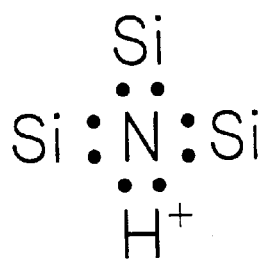
Figure 2:
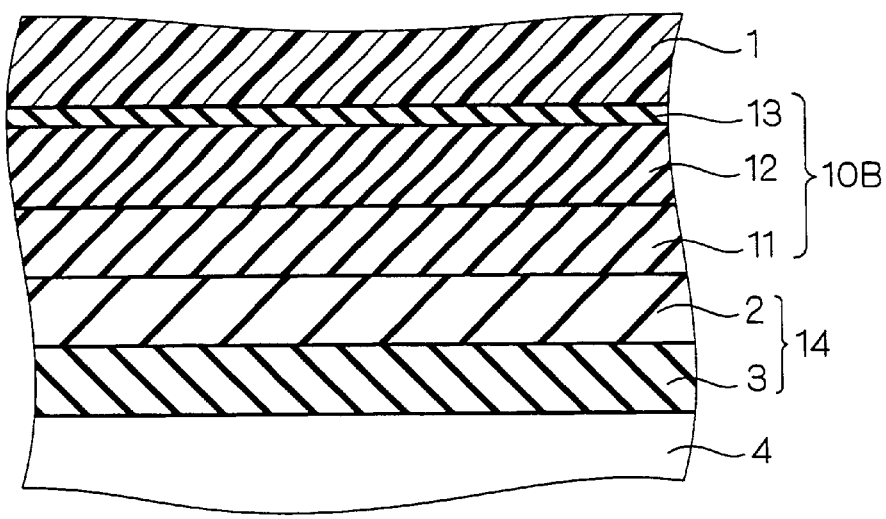
Figure 2:
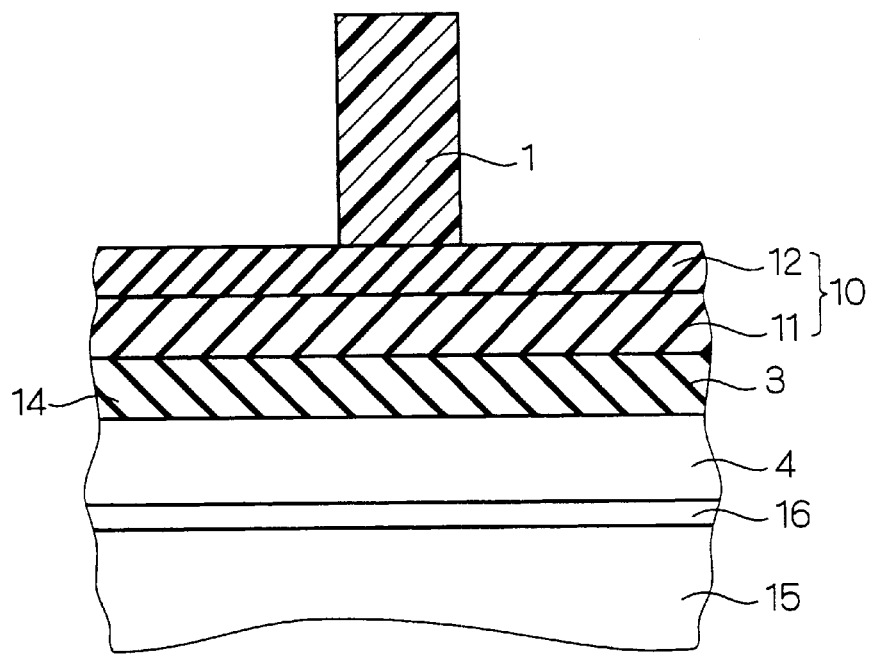
Figure 25:
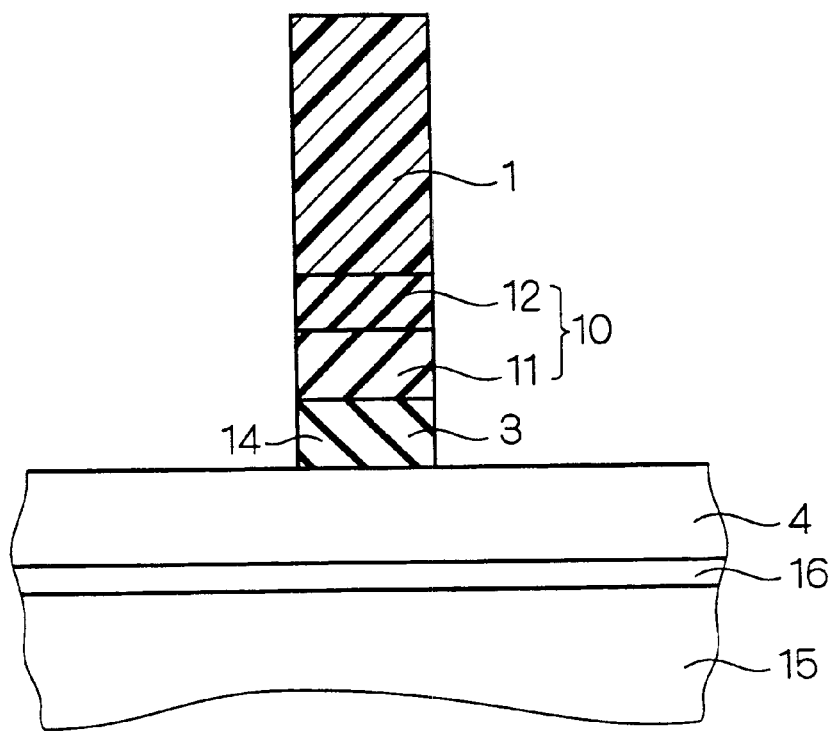
Figure 26:
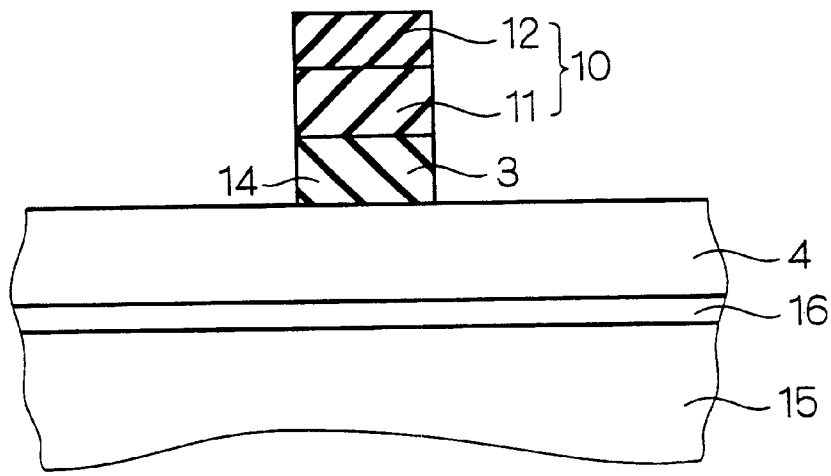

The chemically amplified resists generate acid ($H^+$) on exposure, which alters the solubility in developing. By the way, the chemical covalent bond of the nitride film contains lone-pair electrons (see FIG. 21). Accordingly, when the chemically amplified resist exists on the nitride film, the lone-pair electrons of the nitride film attract the acid ($H^+$) generated during the resist exposure (see FIG. 22). That is to say, the nitride film is basic and therefore lessens the acid, which may hinder accurate resist patterning. Accordingly, a second preferred embodiment explains an antireflection coating suitable for use with the chemically amplified resists.

FIG. 23 is a schematic sectional view used to explain a semiconductor device 102 to which an antireflection coating 10B of the second preferred embodiment is applied. The semiconductor device 102 has a stacked-layer structure of tungsten silicide film 4/oxide film 3/nitride film 2/lower p-SiN film 11/upper p-SiN film 12/surface oxide film 13/resist 1. In this structure, the three layers, the lower p-SiN film 11/upper p-SiN film 12/surface oxide film 13, correspond to the antireflection coating 10B, and the oxide film 3 and the nitride film 2 correspond to the transparent underlying layer 14. The underlying layer 14 may be formed only with the oxide film 3 or the nitride film 2. It is assumed that the resist 1 is chemically amplified.

The surface oxide film 13 is formed as shown below. For example, after the formation of the upper p-SiN film 12, a gas which contains oxygen, e.g. $N_2O$ gas, is introduced into the chamber and plasma is generated, and the exposed surface of the upper p-SiN film 12 is thermally oxidized with oxygen produced by the plasma. More specifically, the surface oxide film 13 is formed under the following conditions: $N_2O$ gas flow rate 1000 sccm; RF power 160 W; pressure 4.25 Torr; temperature 400° C. In this process, the surface oxide film 13 is formed to a thickness of about 10 nm or smaller (preferably about 4 to 5 nm, or smaller) so that it will not prevent the antireflection function of the lower and upper p-SiN films 11 and 12.

With the antireflection coating 10B, the surface oxide film 13 interposed between the chemically amplified resist 1 and the upper p-SiN film 12 prevents the acid ($H^+$) in the resist 1 generated during the exposure from being attracted to the lone-pair electrons in the upper p-SiN film 12. The acid function in the resist 1 is thus not hindered and the resist 1 can be precisely patterned into desired shape.

Furthermore, since the thickness of the surface oxide film 13 is 10 nm or smaller, the surface oxide film 13 and the p-SiN films 12 and 11 can be etched continuously (simultaneously) in the process for etching the antireflection coating 10B. In other words, when the surface oxide film 13 is thicker than 10 nm, the surface oxide film 13 and the p-SiN films 12 and 11 must be separately etched in two steps, which would complicate the etching process.

The surface oxide film 13 can be formed by, instead of the thermal oxidation, depositing an oxide film itself by CVD. However, the thermal oxidation can form the thin surface oxide film 13, 10 nm or thinner, more accurately than CVD. This is because, when thermal oxidation is applied to the surface, the oxidation reaction stops at a depth of about 4 to 5 nm, since the nitride film is resistant to oxidation enough to be used as the antioxidation film. On the other hand, it is technically difficult to stably obtain a film of 10 nm or thinner by the CVD having poor controllability.

In this respect, the thermal oxidation method, capable of forming the surface oxide film 14 as thin as 4 to 5 nm thick, facilitates the continuous etching to the surface oxide film 13 and the p-SiN films 12 and 11. Also, the upper p-SiN film 12 and the surface oxide film 13 (and even the lower p-SiN film 11) can be continuously formed in the same chamber by generating oxygen plasma in the chamber used to form the p-SiN film 12. In this way, forming the surface oxide film 13 by thermal oxidation enhances the productivity in the formation of the antireflection coating 10B.

The surface oxide film 13, having a thickness of about 4 to 5 nm, can satisfactorily prevent the acid in the resist 1 from diminishing. In other words, the surface oxide film 13 can be still thinner as long as it can prevent the acid from being lessened. Other films which are not basic may be used in place of the surface oxide film 13. The antireflection coating 10 can be used when the resist 1 is not chemically amplified.

<Third Preferred Embodiment>

Figure 50:
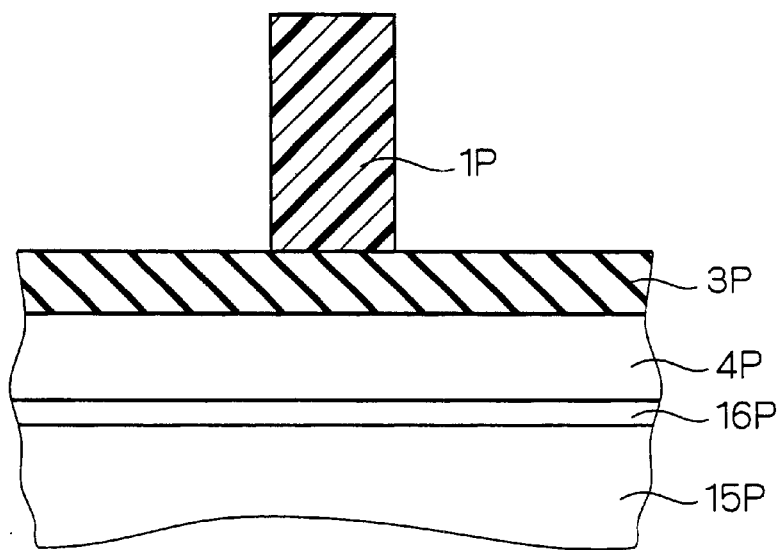
FIG. 50 is a sectional view used to explain a conventional semiconductor device manufacturing method.

In recent devices, the gate oxide film in MOSFETs is as thin as about 2 nm, so that the gate oxide film may be etched during the process of pattern-etching the gate electrode. It is thus difficult to leave the gate oxide film on the active region to protect Si in the active region. For this reason, as shown in the sectional view of FIG. 50, a silicon oxide film 3P is formed on the silicide film 4P for the gate electrode. The oxide film 3P is pattern-etched by using the resist 1P and then the resist 1P is removed. Next the silicide film 4P is etched by using the patterned oxide film 3P as a mask. In this process, the etching conditions are selected so that the oxide film 3P used as a mask will not be etched away, which suppresses etching damage to the gate oxide film 16P.

A third preferred embodiment shows a method for patterning the gate electrode (or a semiconductor device manufacturing method) by using the above-described antireflection coatings 10 and 10B referring to the sectional views of FIGS. 24 to 29.

First, a gate oxide film 16; a film forming the gate electrode later, e.g. the tungsten silicide film 4; the oxide film 3 corresponding to the underlying layer 14; the lower and upper p-SiN films 11 and 12 forming the antireflection coating 10; and the resist 1 are sequentially formed on the silicon substrate 15. The resist 1 is then patterned through exposure and developing (see FIG. 24). Next, by using the patterned resist 1 as a mask, the antireflection coating 10 and the oxide film 3 are pattern-etched (see FIG. 25). Unlike the stoichiometric nitride film ($Si_3N_4$), the p-SiN films 11 and 12 formed by plasma CVD can be etched under etching conditions selected for the oxide film 3 (though the rate is slower), so that the upper and lower p-SiN films 12 and 11 and the oxide film 3 can be continuously (or simultaneously) etched. The rate of continuous etching can be controlled by adjusting the etching conditions on the basis of the etching conditions for the oxide film 3.

Figure 27:
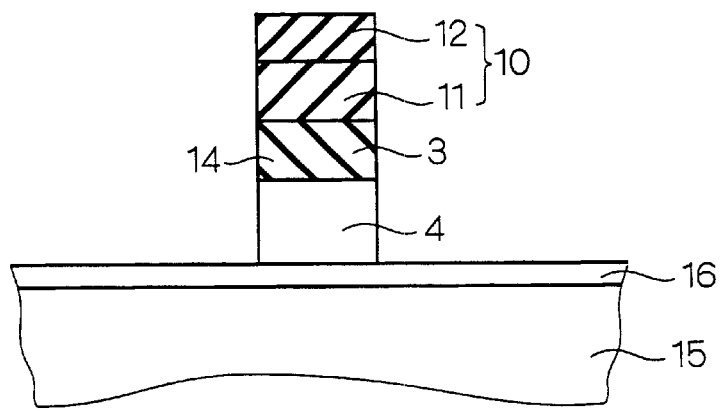
Figure 28:
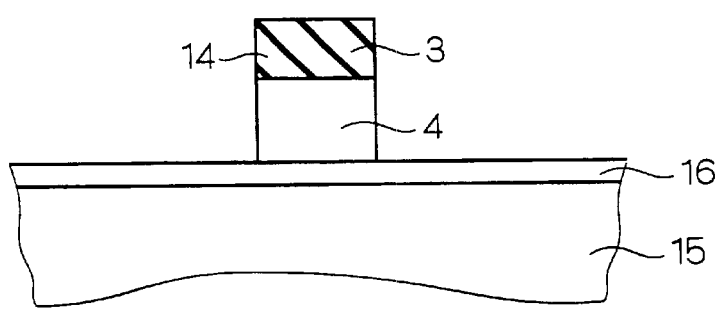
Figure 29:
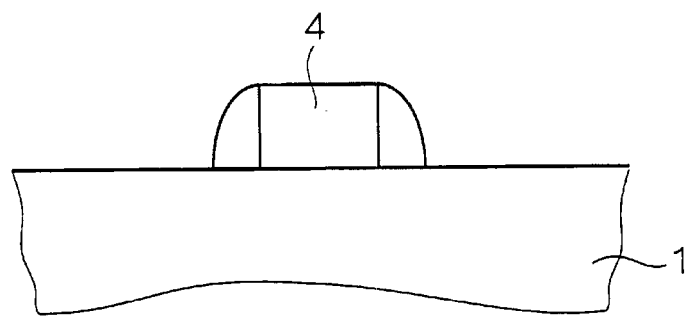

Next, the resist 1 is removed (see FIG. 26) and the silicide film 4 is etched by using the patterned antireflection coating 10 and oxide film 3 as a mask (see FIG. 27). The residue of the antireflection coating 10 is removed by thermal phosphoric acid (see FIG. 28). The thermal phosphoric acid treatment may be unwanted when the antireflection coating 10 has been etched away during etching to the silicide film 4. Then common process is performed to form side walls (see FIG. 29) and source/drain, etc. (not shown) to complete the MOSFET.

The antireflection coating 10 enables the resist 1, and hence the gate electrode, to be precisely patterned. The antireflection coating 10B provides the same effects (this applies also to the fourth to sixth preferred embodiments described later).

<Fourth Preferred Embodiment>

In recent devices, gate electrodes are disposed very close to each other. Therefore a (contact) hole may be formed between, and partially over, adjacent gate electrodes. Such structure is called SAC (Self Align Contact).

In the SAC structure, the hole is formed by etching an interlayer film made of $SiO_2$, so that a nitride film, having large selectivity to $SiO_2$, is formed on the gate electrodes and used as the etching stopper to protect the gate electrodes from etching. Recently, an oxide film may be formed between the nitride film and the gate electrode to alleviate stress caused because the nitride film and the gate electrode are made of different materials.

As stated above, the recent SAC structure has a transparent oxide film and nitride film formed on the gate electrodes. A fourth preferred embodiment shows a method for forming the SAC structure (or a semiconductor device manufacturing method) by using the above-described antireflection coatings 10 and 10B referring to the sectional views of FIGS. 30 to 35.

Figure 30:
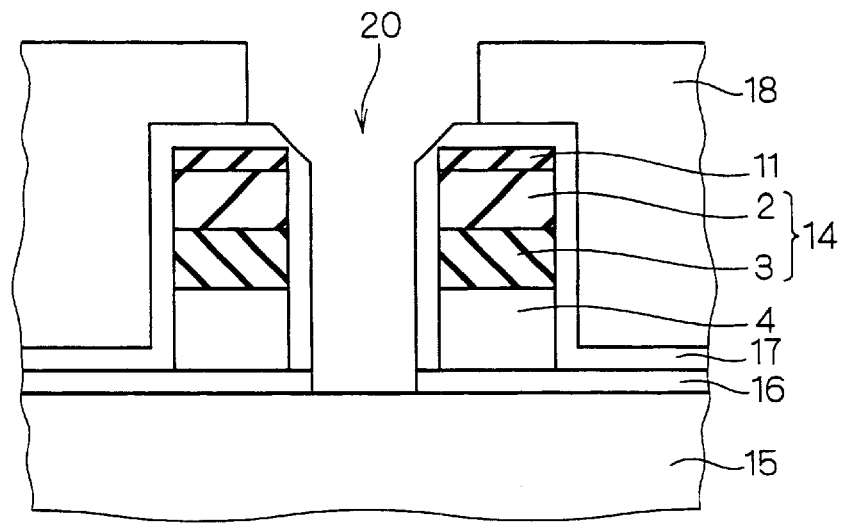
FIGS. 30 to 35 are schematic sectional views used to explain a semiconductor device manufacturing method according to a fourth preferred embodiment.
Figure 31:
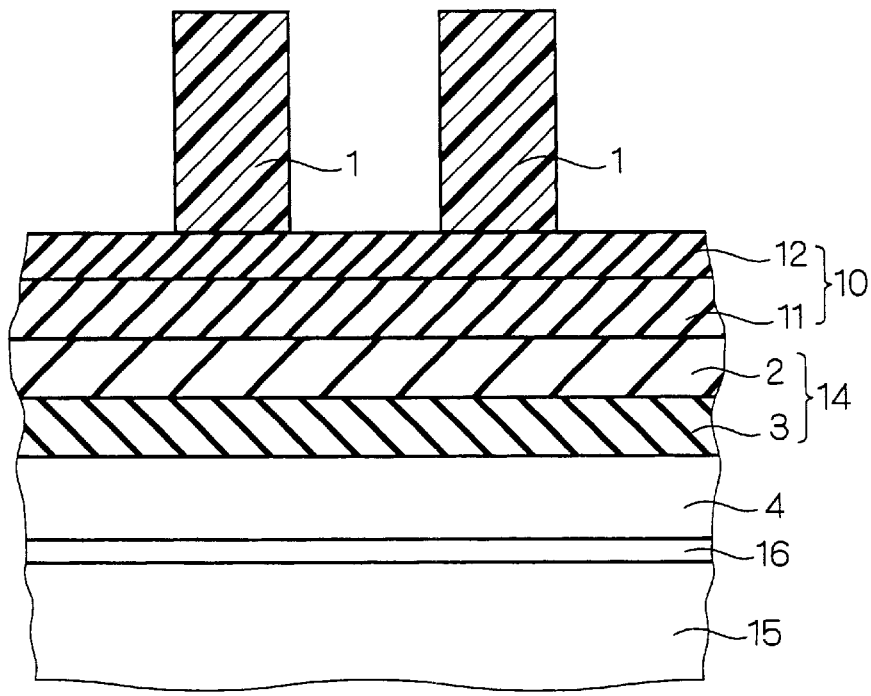
Figure 32:
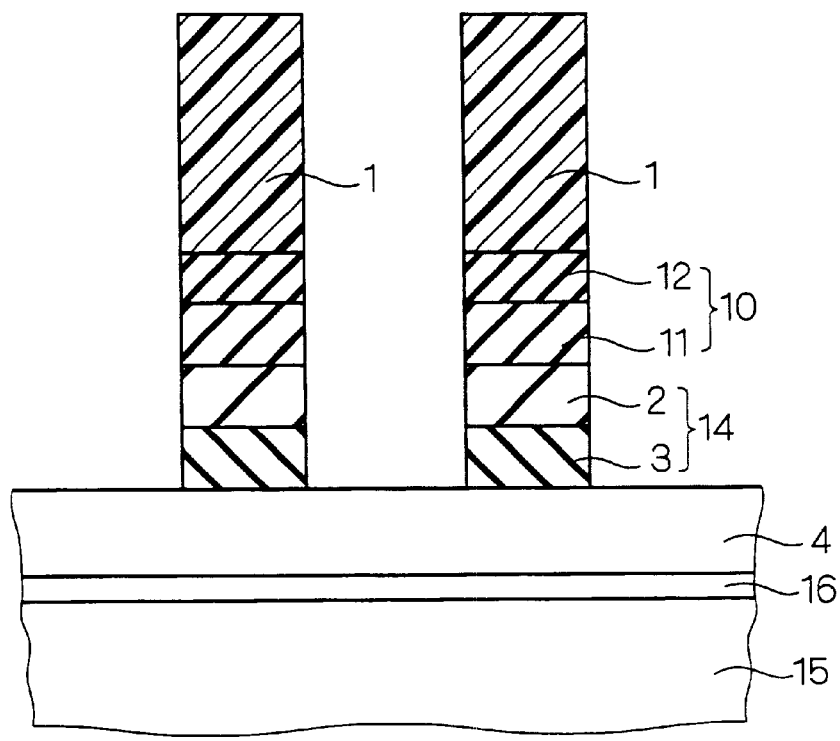
Figure 33:
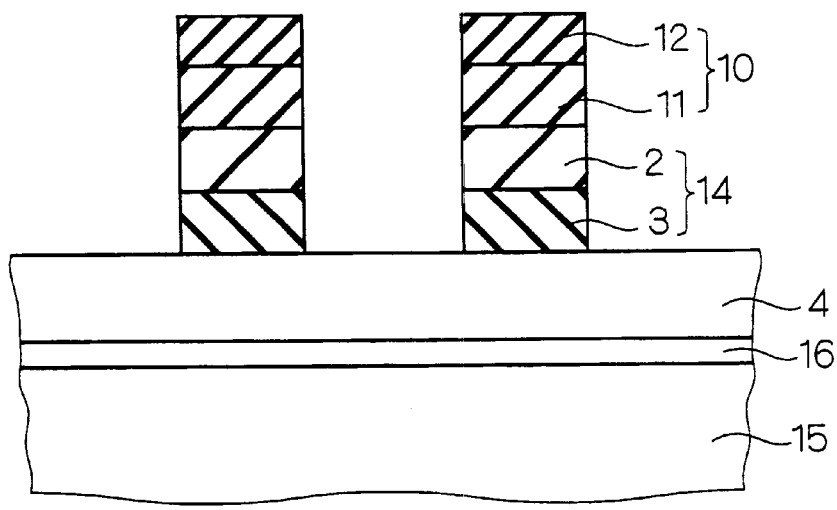

First, a semiconductor device having the SAC structure is described referring to FIG. 30. In the semiconductor device, a gate oxide film 16 is formed on the silicon substrate 15, and gate electrodes 4 composed of, for example, tungsten silicide, are formed on the gate oxide film 16. The oxide film 3, nitride film 2 and p-SiN film 11 are formed in this order on each gate electrode 4. In this structure, the oxide film 3 and the nitride film 2 correspond to the underlying layer. The gate electrode 4, the oxide film 3, the nitride film 2 and the p-SiN film 11 are covered by a nitride film 17, and the nitride film 17 is covered by an interlayer film 18 made of $SiO_2$. The interlayer film 18 has a hole 20; the hole 20 is formed to expose the nitride film 17 in the space between the adjacent gate electrodes 4 and the oxide film 3 formed on the gate electrodes 4 etc. The hole 20 extends in this space and also partially above the gate electrodes 4 (more specifically above the shoulders of the p-SiN film 11). The nitride film 2 serves as an etching stopper during formation of the hole 20.

Next, a method for manufacturing this semiconductor device is described referring to FIGS. 31 to 35. First, the gate oxide film 16; the tungsten silicide film as a film forming the gate electrode 4 later; the oxide film 3; the nitride film 2; the lower and upper p-SiN films 11 and 12 forming the antireflection coating 10; and the resist 1 are sequentially formed on the silicon substrate 15. The resist 1 is then patterned through exposure and developing (see FIG. 31). Subsequently, by using the patterned resist 1 as a mask, the antireflection coating 10 and the underlying layer 14 are pattern-etched (see FIG. 32).

Figure 34:
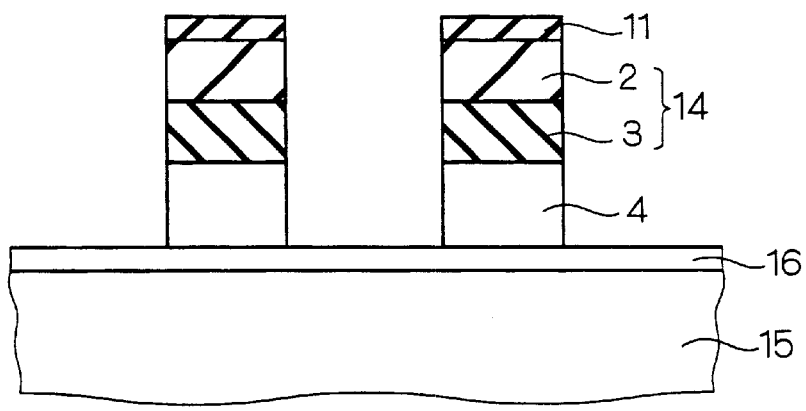
Figure 35:
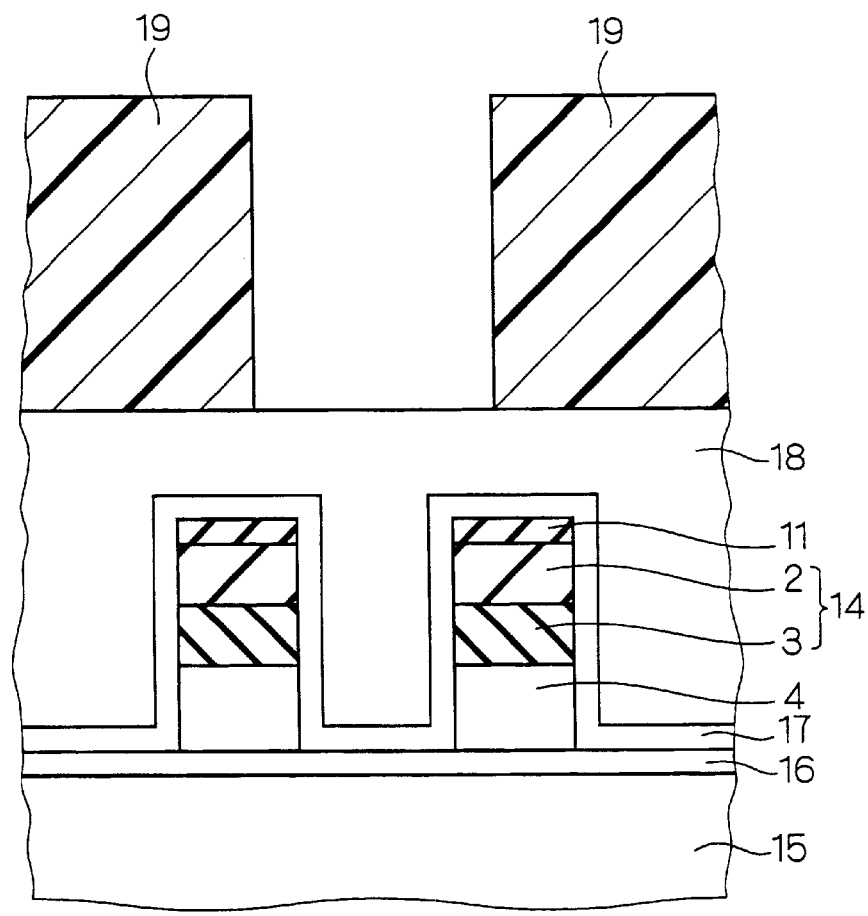

Then the resist 1 is removed (see FIG. 33) and the silicide film 4 is etched by using the patterned antireflection coating 10 and underlying layer 14 as a mask (see FIG. 34). In this process, part of the antireflection coating 10, e.g. part of the lower p-SiN film 11, may remain. Then the nitride film 17 and the interlayer film 18 are sequentially formed to cover the exposed surface. Resist 19 is then formed on the interlayer film 18 and an opening is formed in the resist 19; in the plan view, the opening is formed in an area including parts (shoulders) of the adjacent gate electrodes 4 (i.e. in the area where the contact 20 is formed: see FIG. 35). The interlayer film 18 is etched by using the opened resist 19 as a mask to form the hole 20 (see FIG. 30).

The antireflection coating 10 enables precise patterning of the resist 1 and hence of the gate electrode.

In this process, the use of the antireflection coating 10, or the p-SiN films 11 and 12, reduces the film stress in the semiconductor device. This is because of the following reason. First, since the upper and lower p-SiN films 11 and 12 can be used also as the etching stopper, the nitride film 2 serving as the etching stopper can be formed thinner than in the absence of the antireflection coating 10; or the nitride film 2 may be omitted. This reduces the film stress of the nitride film 2. Now, the p-SiN film formed by plasma CVD generally produces smaller film stress than the stoichiometric $Si_3N_4$ film, so that the stress reducing effect by thinning the nitride film 2 can be obtained even when the p-SiN films 11 and 12 are used. Also, the p-SiN films 11 and 12 generally offer higher deposition rate than the nitride film 2 of stoichiometric silicon nitride ($Si_3N_4$), leading to superior productivity in the stopper formation.

<Fifth Preferred Embodiment>

Figure 36:
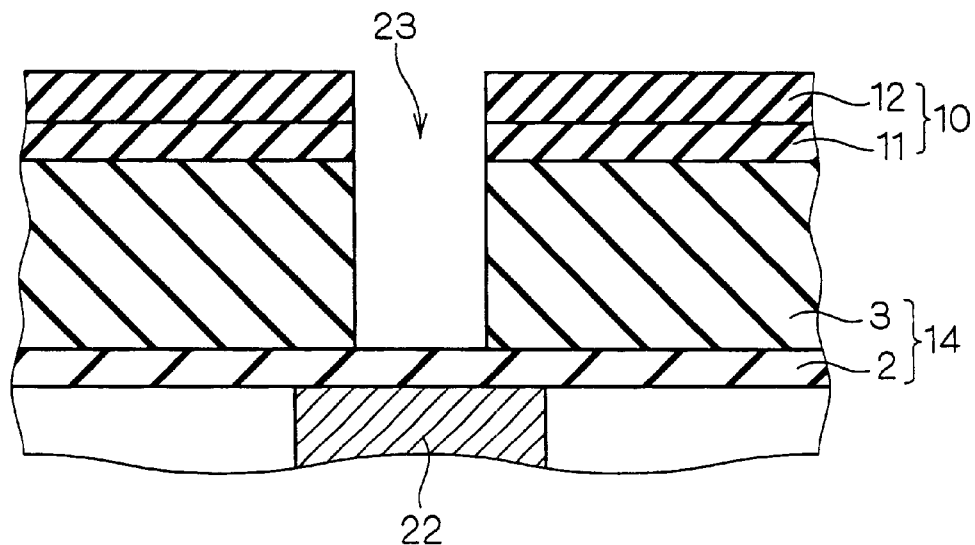
FIGS. 36 to 38 are schematic sectional views used to explain a semiconductor device manufacturing method according to a fifth preferred embodiment.
Figure 37:
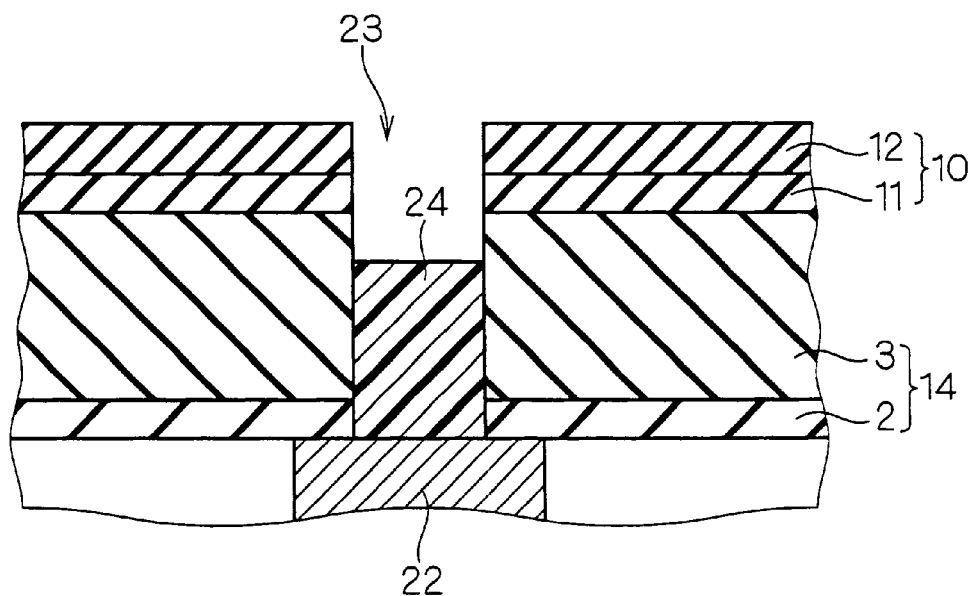
Figure 38:
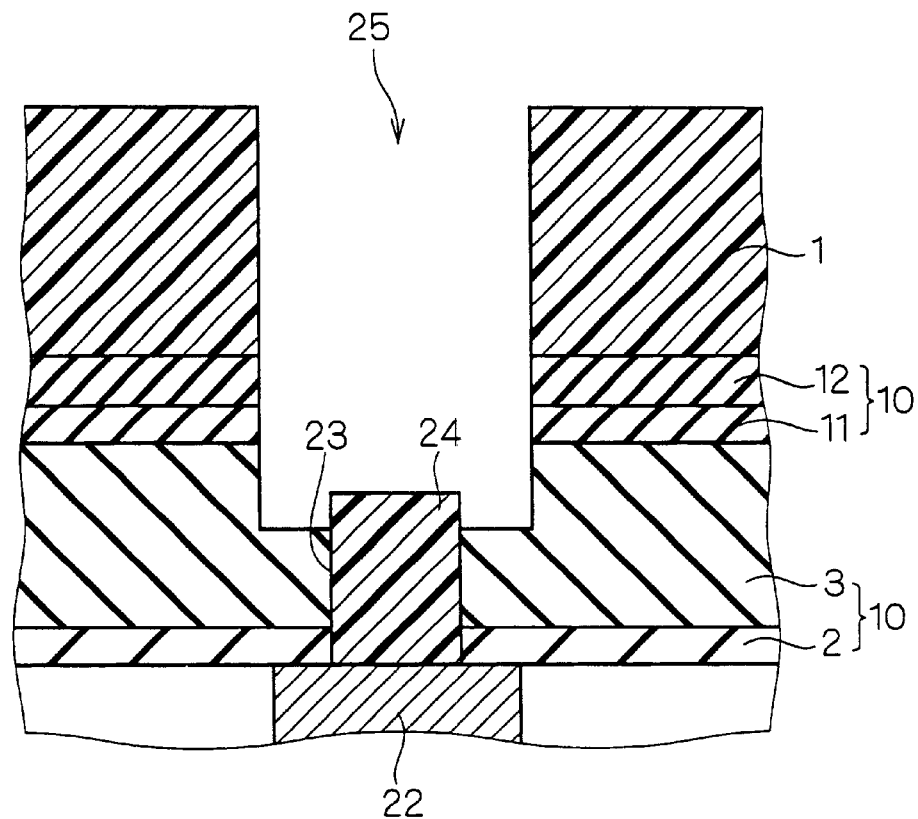

A fifth preferred embodiment explains a dual damascene process (or a semiconductor device manufacturing method) using the antireflection coatings 10 and 10B referring to the sectional views of FIGS. 36 to 38. The description shows a dual damascene process in which a trench is formed after formation of a hole (called "via first").

First, the nitride film 2, the oxide film 3 as an interlayer film, the lower p-SiN film 11 and the upper p-SiN film 12 are sequentially formed to cover the interconnection 22 on the substrate. The nitride film 2 and the oxide film 3 correspond to the underlying layer 14. Then the antireflection coating 10 and the oxide film 3 are patterned by using resist to form a hole 23 above the interconnection 22 (see FIG. 36). Then the nitride film 2 is pattern-etched to extend the hole 23 so that it reaches the interconnection 22. Resist (not shown) is then applied to cover the antireflection coating 10 and the entire surface is etched back. The resist (also called a resist plug) 24 is thus buried in the hole 23 (see FIG. 37). It is buried to prevent the bottom of the hole 23 from being exposed for a long time to the etching plasma during the formation of a trench described later.

Next, the resist 1 is formed to cover the antireflection coating 10 and the hole 23 and is patterned through exposure and developing into a shape corresponding to the trench 25 (see FIG. 38) connected to the hole 23. The antireflection coating 10 and the oxide film 3 are etched by using the resist 1 as a mask, so as to form the trench 25 (see FIG. 38).

While negative resist and positive resist are both applicable as the resist 1 used to form the trench 25, the negative resist offers more accurate patterning of the resist 1. This is because of the following reason. That is to say, during formation of the trench, the resist 1 is removed above the hole 23. Therefore, if positive resist is used (it is removed in the exposed areas), the exposure light must be applied above the hole 23. However, the exposure light may be scattered by the hole 23, or may not sufficiently reach into the hole 23. In contrast, since the negative resist is exposed to the light in the areas to remain, i.e. since the exposure light is not applied onto the hole 23, the resist 1 can be patterned more accurately. It is therefore preferable to use the negative resist as the resist 1.

Figure 39:
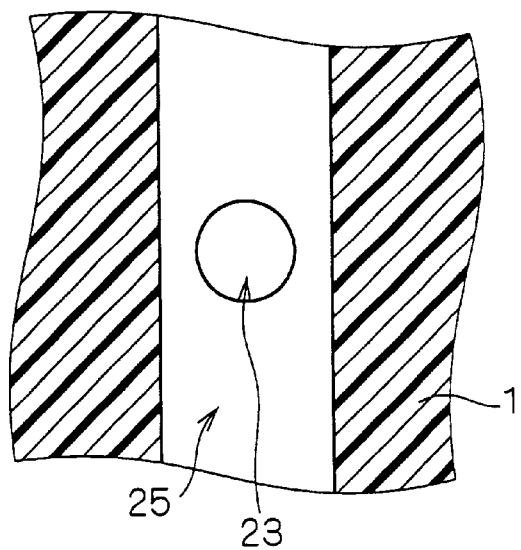
FIG. 39 is a schematic plan view used to explain the semiconductor device of the fifth preferred embodiment.
Figure 51:
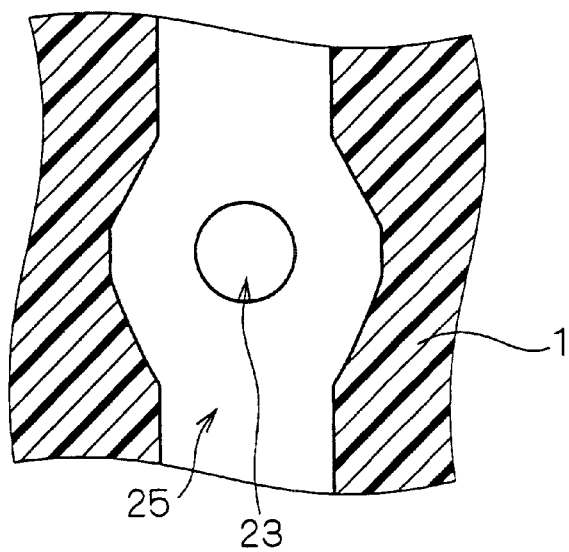
FIG. 51 is a schematic plan used to explain a conventional semiconductor device.

FIG. 39 is a schematic plan view showing a semiconductor device having the hole 23 and the trench 25 formed by using the antireflection coating 10. For comparison, FIG. 51 shows a plan view of a similar semiconductor device manufactured by using the conventional single-layer antireflection coating 10P. Since the lower p-SiN film 11 of the antireflection coating 10 is more light-blocking than the conventional single-layer antireflection coating 10P (since it has a larger imaginary part k), the exposure light is less likely to be transmitted through the antireflection coating 10 and light scattering is therefore less likely to occur at the interconnection metal. Therefore the antireflection coating 10 allows the resist 1, and hence the trench 25, to be accurately patterned. More specifically, this enhances the straightness (linearity) of the trench 25 around the hole 23. It is supposed that, when the conventional antireflection coating 10P is used, the trench 25 is widened around the hole 23 as shown in FIG. 51 because the exposure light is weakened by scattering around the hole 23.

<Sixth Preferred Embodiment>

Recent devices widely include element isolation called shallow trench isolation (STI). A sixth preferred embodiment shows a method for forming element isolation having the STI structure (or a semiconductor device manufacturing method) by using the antireflection coatings 10 and 10B.

Figure 40:
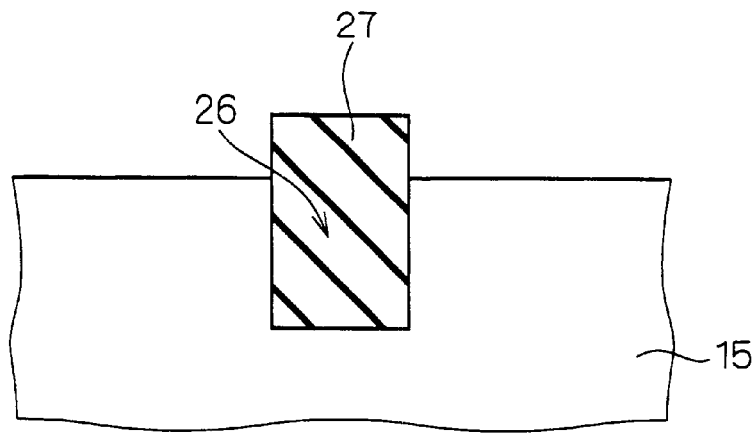
FIG. 40 is a schematic sectional view to explain a semiconductor device according to a sixth preferred embodiment.

First, a semiconductor device having an STI element isolation is described referring to the schematic section of FIG. 40. This semiconductor device has a silicon substrate 15 in which a trench 26 is formed; the trench 26 is filled with an insulating film (e.g. $SiO_2$ film) 27 forming the element isolation. The insulating film 27 protrudes above the surface of the silicon substrate 15.

Figure 41:
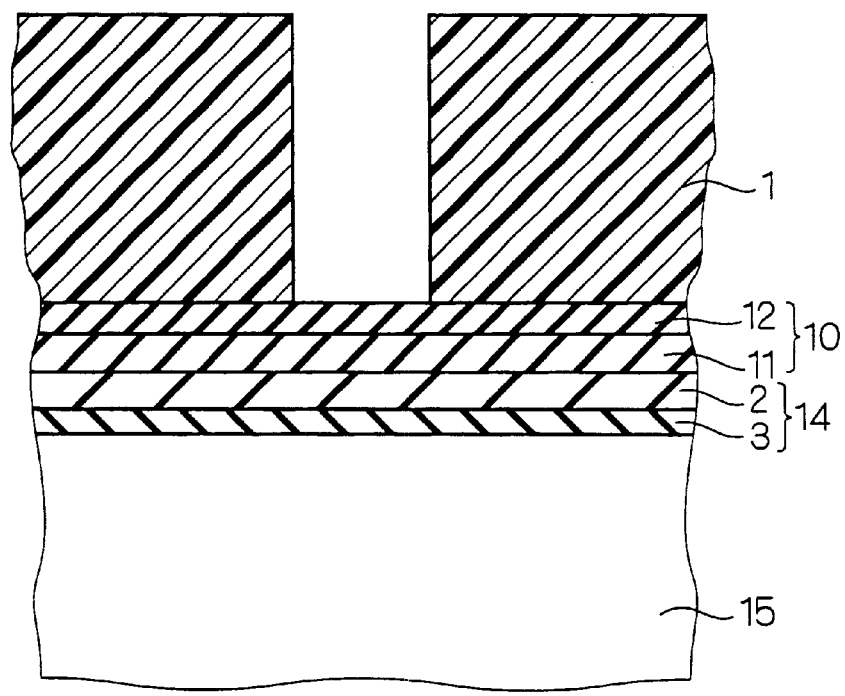
FIGS. 41 to 44 are schematic sectional views used to explain the semiconductor device manufacturing method according to the sixth preferred embodiment.
Figure 42:
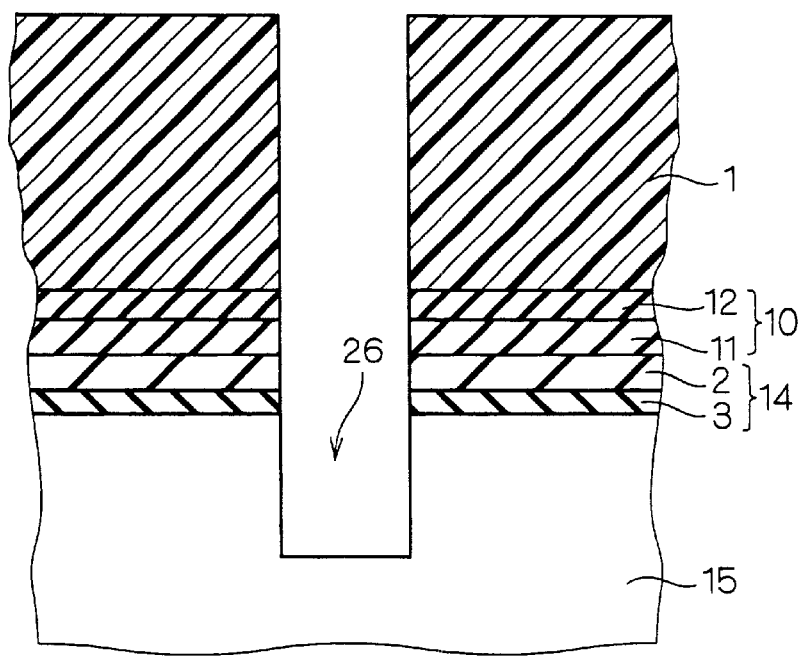
Figure 43:
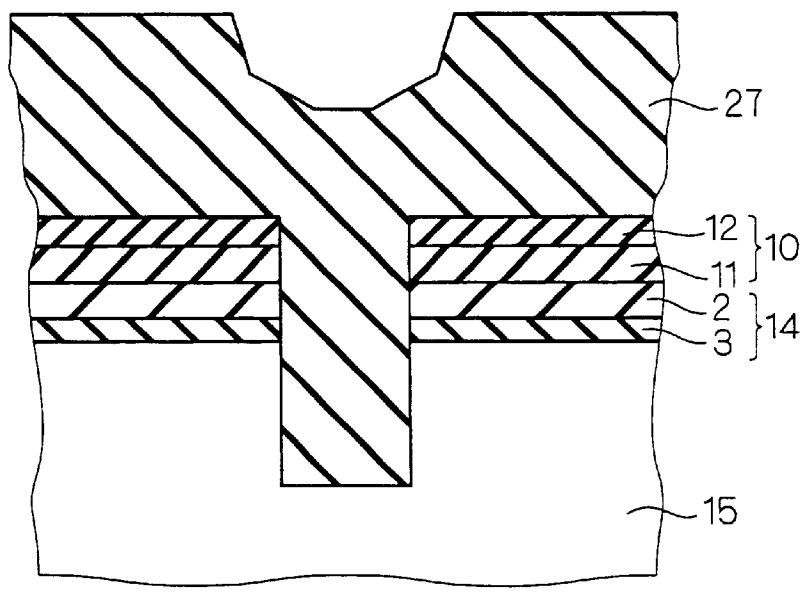
Figure 44:
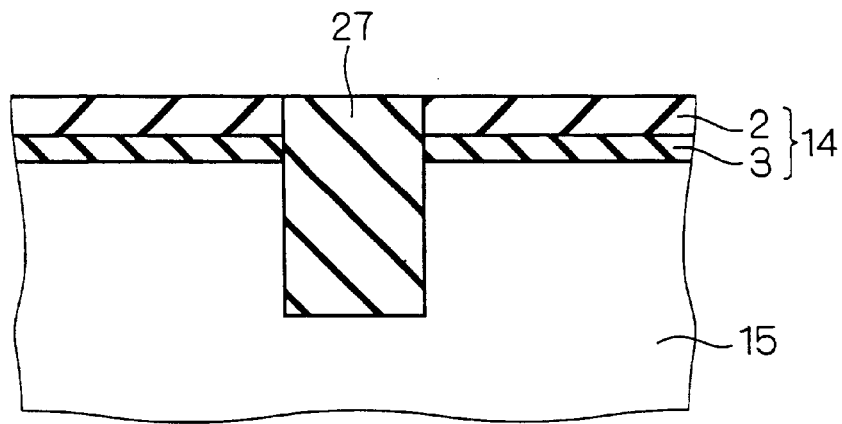

Next, a method for manufacturing this semiconductor device is described referring to the sectional views of FIGS. 41 to 44. First, the oxide film 3, nitride film 2, lower p-SiN film 11, upper p-SiN film 12 and resist 1 are formed in this order on the silicon substrate 15. The oxide film 3 and the nitride film 2 correspond to the underlying layer 14. The nitride film 2 serves as a stopper during CMP process described later. Next, the resist 1 is patterned to form an opening in the part where the trench 26 is to be formed (see FIG. 41). For comparison with FIG. 41, FIG. 52 shows a conventional manufacturing method which does not use the antireflection coating 10.

The nitride film 2 and the oxide film 3 are etched by using the resist 1 as a mask. The silicon substrate 15 is then etched by using the resist 1, the nitride film 2 and the oxide film 3 as a mask to form the trench 26 (see FIG. 42). Alternatively, the silicon substrate 15 may be etched after removal of the resist 1 by using the nitride film 2 and the oxide film 3 as a mask. The resist 1 is then removed and the insulating film 27 is formed to fill the trench 26 and to cover the antireflection coating 10 (see FIG. 43), and then the insulating film 27 is polished by CMP for planarization (see FIG. 44). Subsequently the residue of the nitride film 2 and the oxide film 3 (and the antireflection coating 10 if any) is removed to complete the semiconductor device shown in FIG. 40.

The antireflection coating 10 enables the resist 1, and hence the trench 27 of the STI structure, to be accurately patterned.

Moreover, when polishing the insulating film 27, the upper and lower p-SiN films 12 and 11 can be used as the stopper, as well as the nitride film 2. Therefore the nitride film 2, which is used also in conventional manufacturing methods, can be formed thinner or removed. The p-SiN films 11 and 12 generally offer higher deposition rate than the nitride film 2 made of stoichiometric silicon nitride ($Si_3N_4$), so that the productivity in the stopper formation can be enhanced. Also, thinning the nitride film 2 reduces the film stress. In general, since the p-SiN film produces smaller film stress than the stoichiometric $Si_3N_4$ film, the above-described stress reducing effect produced by thinning the nitride film 2 can be obtained even when the p-SiN films 11 and 12 are used.

It is also possible to use the upper and lower plasma silicon nitride films 12 and 11 as a stopper during both of the CMP and etching processes in the series of manufacturing process steps.

While the invention has been described in detail, the foregoing description is in all aspects illustrative and not restrictive. It is understood that numerous other modifications and variations can be devised without departing from the scope of the invention.

What is claimed is:

1. An antireflection coating provided between an underlying layer and a resist in a semiconductor device manufacturing process, said antireflection coating comprising:
   a lower plasma silicon nitride film provided on said underlying layer, said lower plasma silicon nitride film being formed by a plasma chemical vapor deposition and containing more silicon than stoichiometric silicon nitride ($Si_3N_4$); and
   an upper plasma silicon nitride film provided on said lower plasma silicon nitride film, said upper plasma silicon nitride film being formed by said plasma chemical vapor deposition and containing more silicon than said stoichiometric silicon nitride ($Si_3N_4$);
   said lower plasma silicon nitride film having a complex index of refraction in which the real part and the imaginary part have values respectively in the range of not less than 1.9 nor more than 2.5 and in the range of not less than 0.9 nor more than 1.7, said lower plasma silicon nitride film having a thickness in the range of not less than 20 nm nor more than 60 nm,
   said upper plasma silicon nitride film having a complex index of refraction in which the real part and the imaginary part have values respectively in the range of not less than 1.7 nor more than 2.4 and in the range of not less than 0.15 nor more than 0.75, said upper plasma silicon nitride film having a thickness in the range of not less than 10 nm nor more than 40 nm.

2. The antireflection coating according to claim 1, wherein said complex index of refraction of said lower plasma silicon nitride film is ($2.1-i \times 1.2$) and the thickness of said lower plasma silicon nitride film is 50 nm, and
   said complex index of refraction of said upper plasma silicon nitride film is ($2.0-i \times 0.3$) and the thickness of said upper plasma silicon nitride film is 30 nm.

3. The antireflection coating according to claim 1, further comprising a silicon oxide film formed on said upper plasma silicon nitride film.

4. The antireflection coating according to claim 3, wherein said silicon oxide film has a thickness of about 4 to 10 nm.

5. A semiconductor device manufacturing method comprising the steps of:
   (a) forming an underlying layer;
   (b) forming an antireflection coating on said underlying layer; and
   (c) forming a resist on said antireflection coating and patterning said resist through exposure and developing;
   said step (b) comprising the steps of,
   (b-1) forming a lower plasma silicon nitride film on said underlying layer by a plasma chemical vapor deposition, said lower plasma silicon nitride film containing more silicon than stoichiometric silicon nitride ($Si_3N_4$), and
   (b-2) forming an upper plasma silicon nitride film on said lower plasma silicon nitride film by said plasma chemical vapor deposition, said upper plasma silicon nitride film containing more said silicon than said stoichiometric silicon nitride ($Si_3N_4$),
   said lower plasma silicon nitride film having a complex index of refraction in which the real part and the imaginary part have values respectively in the range of not less than 1.9 nor more than 2.5 and in the range of not less than 0.9 nor more than 1.7, said lower plasma silicon nitride film having a thickness in the range of not less than 20 nm nor more than 60 nm,
   said upper plasma silicon nitride film having a complex index of refraction in which the real part and the imaginary part have values respectively in the range of not less than 1.7 nor more than 2.4 and in the range of not less than 0.15 nor more than 0.75, said upper plasma silicon nitride film having a thickness in the range of not less than 10 nm nor more than 40 nm.

6. The semiconductor device manufacturing method according to claim 5,
   wherein said complex index of refraction of said lower plasma silicon nitride film is ($2.1-i \times 1.2$) and the thickness of said lower plasma silicon nitride film is 50 nm, and
   said complex index of refraction of said upper plasma silicon nitride film is ($2.0-i \times 0.3$) and the thickness of said upper plasma silicon nitride film is 30 nm.

7. The semiconductor device manufacturing method according to claim 5, wherein said step (b-1) and said step (b-2) are continuously performed in the same chamber.

8. The semiconductor device manufacturing method according to claim 5, wherein said step (b) further comprises a step (b-3) of exposing an exposed surface of said upper plasma silicon nitride film to a plasma of a gas which contains oxygen to form a thermal oxide film.

9. The semiconductor device manufacturing method according to claim 5, further comprising the steps of;
   (d) forming a silicon oxide film covering said upper and lower plasma silicon nitride films, and
   (e) applying at least one of an etching process and a polishing process to said silicon oxide film.

* * * * *